(12) United States Patent
Xiao et al.

(10) Patent No.: US 8,865,297 B2
(45) Date of Patent: Oct. 21, 2014

(54) HETEROGENEOUS SURFACES

(71) Applicant: Massachusetts Institute of Technology, Cambridge, MA (US)

(72) Inventors: Rong Xiao, Houston, TX (US); Nenad Miljkovic, Cambridge, MA (US); Evelyn N. Wang, Cambridge, MA (US); Ryan Enright, Whitestone, NY (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 13/908,439

(22) Filed: Jun. 3, 2013

(65) Prior Publication Data

US 2014/0017456 A1    Jan. 16, 2014

Related U.S. Application Data

(60) Provisional application No. 61/654,945, filed on Jun. 3, 2012.

(51) Int. Cl.
*B32B 3/00* (2006.01)
*B32B 5/00* (2006.01)
*B08B 17/06* (2006.01)
*C09D 5/16* (2006.01)
*B05D 5/02* (2006.01)
*B81C 1/00* (2006.01)
*F03D 11/00* (2006.01)
*B64D 15/00* (2006.01)

(52) U.S. Cl.
CPC ............. *B05D 5/02* (2013.01); *D06M 2200/05* (2013.01); *B32B 5/00* (2013.01); *B08B 17/065* (2013.01); *C09D 5/1681* (2013.01); *B81C 1/00206* (2013.01); *F03D 11/0025* (2013.01); *B64D 15/00* (2013.01)
USPC .......................... 428/195.1; 428/201; 428/141

(58) Field of Classification Search
USPC ....................................... 428/195.1, 201, 141
See application file for complete search history.

(56) References Cited

U.S. PATENT DOCUMENTS

| | | | |
|---|---|---|---|
| 2012/0052241 A1* | 3/2012 | King et al. | 428/141 |
| 2013/0244001 A1* | 9/2013 | Wang et al. | 428/141 |
| 2014/0011013 A1* | 1/2014 | Jin et al. | 428/297.4 |

* cited by examiner

Primary Examiner — Elizabeth Mulvaney
(74) Attorney, Agent, or Firm — Steptoe & Johnson LLP

(57) ABSTRACT

Condensation can be an important process in both emerging and traditional power generation and water desalination technologies. Superhydrophobic nanostructures can promise enhanced condensation heat transfer by reducing the characteristic size of departing droplets via a surface-tension-driven mechanism. A superhydrophobic surface can include a heterogeneous surface.

14 Claims, 15 Drawing Sheets

HETEROGENEOUS SURFACES

CLAIM OF PRIORITY

This application claims priority to U.S. Application No. 61/654,945, filed Jun. 3, 2012, of which is incorporated by reference in its entirety.

GOVERNMENT SPONSORSHIP

This invention was made with government support under Contract No. N00014-09-1-1000 awarded by the U.S. Navy. The government has certain rights in this invention.

TECHNICAL FIELD

The present invention relates to heterogeneous surfaces.

BACKGROUND

Superhydrophobic surfaces have received significant interest for dropwise condensation to increase the efficiency of energy applications such as heat exchangers, power plants, and solar thermal energy conversion systems. However, nucleation densities on regular superhydrophobic surfaces are difficult to achieve due to the high energy barrier for nuclei formation and hence enhancement of heat transfer can be limited.

SUMMARY

In general, heterogeneous surface structures can be made by infusing microstructured surfaces with low-surface tension oil, which lead to nucleation densities that were increased by over an order of magnitude while maintaining low droplet adhesion. The approach offers a simple and scalable approach to create surfaces that can be tailored for enhanced heat transfer.

In one aspect, a superhydrophobic surface can include a patterned substrate having a surface including a plurality of first regions distributed in a second hydrophobic region, the first regions including a surface modifying layer and the second hydrophobic region including a material infused into regions of the substrate. The first regions can have hydrophobic features and hydrophilic features.

In another aspect, a method of increasing nucleation density on a surface can include infusing a material into regions of a patterned substrate to form a surface including a plurality of first regions distributed in a second hydrophobic region, the first regions including a surface modifying layer and the second hydrophobic region including a material infused into regions of the substrate.

In certain embodiments, the patterned substrate can include a periodic structure on the surface of the substrate that form the regions of the substrate into which the material is infused. The first regions can be associated with the pattern of the patterned substrate. The periodic structure can be a micropillar or microcolumn.

In certain embodiments, the surface modifying layer can include a functionalized silane. In certain circumstances, the surface modifying layer can include a plurality of scattered hydrophilic sites while exhibiting overall hydrophobicity.

In other embodiments, the material can be an oil or wax. The oil can be a fluorinated oil.

Other features, objects, and advantages will be apparent from the description and drawings, and from the claims.

BRIEF DESCRIPTION OF THE DRAWINGS

FIG. 14B is a series of photographs depicting droplet shedding radii on a Krytox oil-infused immersion condensation surface.

DETAILED DESCRIPTION

Figure 1A:
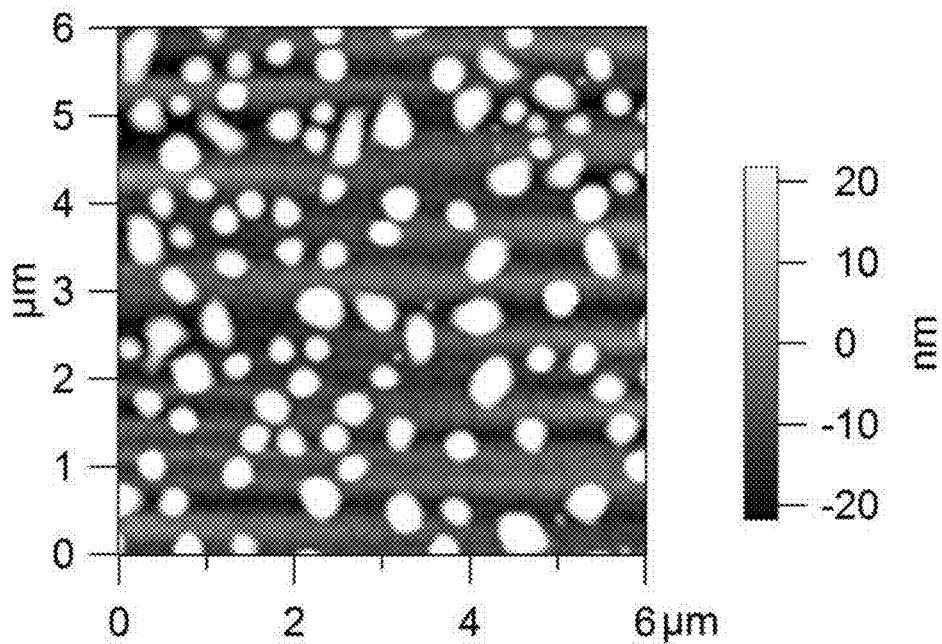
FIGS. 1A to 1D represent atomic force microscopy images of surfaces.

Condensation heat transfer has wide applications in various systems such as heat exchangers, heat pipes and power plants. The heat transfer coefficient of condensation is of great significance to the efficiency of such systems. Dropwise condensation, where the condensate forms discrete droplets rather than continuous films covering the substrate, is considered as one of the most promising approaches to enhance the heat transfer coefficient. Previous work has demonstrated the application of nanostructured superhydrophobic surfaces where condensate can be spontaneously removed via a surface-tension-driven mechanism. See, for example, J. B. Boreyko and C.-H. Chen, "Self-Propelled Dropwise Condensate on Superhydrophobic Surfaces", *PRL*, 2009. 103(18): p. 184501, which is incorporated by reference in its entirety. However, the nucleation density on these surfaces is relatively low since the phase change process relies on high energy active sites to initiate nucleation at low supersaturations (low $\Delta T$), limiting the overall heat transfer performance. Furthermore, air pockets trapped beneath the droplets during growth reduce the contact area between the condensing droplet and substrate, which increases the thermal resistance and reduces the heat transfer coefficient. See, for example, N. Miljkovic, R. Enright, and E. N. Wang, "Effect of Droplet Morphology on Growth Dynamics and Heat Transfer during Condensation on Superhydrophobic Nanostructured Surfaces", *ACS Nano,* 2012 6(2): p. 1776-1785, which is incorporated by reference in its entirety.

Recently, Wong et al. demonstrated a liquid-solid composite surface created by infusing a porous fluoropolymer with water-immiscible, low-surface-tension Krytox oil. See, for example, T.-S. Wong, S. H. Kang, S. K. Y. Tang, E. J. Smythe, B. D. Hatton, A. Grinthal and J. Aizenberg, "Bioinspired self-repairing slippery surfaces with pressure-stable omniphobicity", *Nature,* 2011. 477: p. 443-447, which is incorporated by reference in its entirety. On such a composite surface, the contact area between droplet and substrate can be large while contact line pinning remains very low allowing easy removal of droplets. These properties make the surfaces potentially suitable for enhanced condensation heat transfer. While such behavior is possible with the proper choice of silane, e.g., dichlorodimethylsilane on $SiO_2$, the nucleation density is limited by the presence of high surface energy defects and contaminants at low supersaturations (low $\Delta T$). The nucleation density on oil-infused, silane-coated structured surfaces can be significantly increased by the use of disordered long-chain silane coatings that result in nucleation sites limited only by the density of pillar structures comprising the surface. The increase in the nucleation density can be explained by heterogeneity in the surface energy of the silane coating and the reduced water-oil interfacial energy. This effect could potentially be used to significantly improve the heat transfer coefficient in condensation by controlling the nucleation density.

The surfaces described herein can increase the nucleation density during condensation process while maintaining the easy removal of condensate to enhance condensation rates. In order to achieve this, the surface can include three components. The first is a surface coating which is overall hydrophobic with local nanometer or micrometer scale hydrophilic sites, which create a heterogeneous surface structure. The purpose of the heterogeneity is to provide nucleation sites for condensation to happen while the overall hydrophobicity allows the easy removal of the condensate. The second is a filling fluid which is immiscible with the condensate and has low interfacial tension with the condensate. The filling serves for two purposes: providing a reduced interfacial tension between the condensate and the oil to reduce the energy cost of condensation; and help to remove the condensate from the substrate. The third component is micrometer or nanometer scale roughness to enhance the wetting of the filling fluid.

In particular, a superhydrophobic surface can be formed on a substrate from a pattern on the surface of a substrate. The pattern can be formed from a plurality of structures on the substrate. The structures can have nanometer sized or micrometer sized features. The features can be bumps, columns, pillars, channel, or trough. The features can be periodically spaced on the surface. For example, the features can be less than 10 micrometers, less than 5 micrometers, less than 2 micrometers, less than 1 micrometer, less than 0.5 micrometers, or less than 0.1 micrometers in width. The features can be spaced in intervals of about 0.5 micrometer, 1 micrometer, 2 micrometers, 5 micrometers, 10 micrometers or 20 micrometers, or more, from each other on the surface. The features can have a height of about 0.5 micrometer, 1 micrometer, 2 micrometers, 5 micrometers, 10 micrometers or 20 micrometers. In certain circumstances, the features are etched or machined from the substrate. In other circumstances, one or more feature can be grown or deposited on the surface of the substrate.

Once the patterned substrate has been formed, the surface can be coated with one or more coating layers. The coating layer can be selected to impart desired properties on the surface, such as, for example, mechanical robustness or increased hydrophobicity, or both. For example, the superhydrophobic surface can include a surface modifying layer on at least a portion of the nanostructures. The surface modifying layer can be a single layer or a multilayer. For example, an initial coating layer, e.g., a metallic layer can be deposited by (for example) electroless plating, chemical vapor deposition or atomic layer deposition. The initial coating layer can be a polymer or a metal. The surface modifying layer can be a hydrophobic material, such as a polymer or self-assembled monolayer, directly on the nanostructure or on the initial coating layer. For example, a silane or a thiol can be assembled on a surface. The hydrophobic material; e.g., a hydrophobic polymer, hydrophobic thiol, hydrophobic carboxylic acid or hydrophobic silane, can include hydrocarbon (e.g., a saturated hydrocarbon) groups, halohydrocarbon groups (e.g., a saturated fluorohydrocarbon), or halocarbon groups (e.g., a perfluorinated alkyl group). In certain examples, the hydrophobic material can be trichloro(1H,1H,2H,2H-perfluorooctyl) silane, (tridecafluoro-1,1,2,2-tetrahydrooctyl)-1-trichlorosilane, (1H,1H,2H,2H-perfluorodecyl acrylate), a Teflon amorphous fluoropolymer resin, or an alkyl or fluoroalkyl thiol deposited by appropriate techniques. The hydrophobic material can have $C_2$-$C_{18}$ groups that can be fluorinated to varying degrees. The trifluoromethyl or difluoromethyl groups on the surface can allow the surface properties to be tailored, for example, to have advancing wetting angles of 105, 110, 115 or 120 degrees, depending on the choice of fluorinated alkyl group and base structure. The coatings can have a plurality of hydrophilic sites scattered in the overall hydrophobic background. The size of the hydrophilic sites can be 10 nanometer, 100 nanometer or 500 nanometer. The fraction of hydrophilic sites can be 1%, 5%, 10% or 40%. The local contact angles of the hydrophilic sites can be 50-70 degrees.

The surface modified patterned substrate can then be infused with a material. The infusion of the material can include drop coating, dip coating or roll coating the surface with the material. The material can be an oil, for example a fluorinated oil, or low melting point solid, such as a wax. The material can be a low surface tension material, which can allow it to infuse the pattern readily and completely.

For example, FIG. 1A represents an atomic force microscope (AFM) image of an example heterogeneous surface created by silane deposition on silicon surface. The bright spots in the image are hydrophilic sites. The local contact angle of water on the hydrophobic area is around 122° and the contact angle on the hydrophilic sites is around 60°. The overall advancing and receding contact angle on the whole surface is 122° and 78°, respectively.

Oil-impregnated surfaces have been recently reported as a promising approach to enhance condensation heat transfer surfaces due to the ultra-low droplet adhesion. However, easy droplet removal is not the only desired property for high heat transfer performance. Low contact angle and high nucleation densities are also essential to further enhance condensation heat transfer. By combining surface heterogeneity and oil-infusion, the nucleation density in condensation can be increased by over an order of magnitude via immersion condensation while maintaining low droplet adhesion. The increase in nucleation densities via the a combined effect of heterogeneity and the reduced oil-water interfacial tension was explained by this disclosure based on classical nucleation theory, which were also corroborated with control experiments using silane-coated silicon micropillar arrays. With improved understanding of the physics, oil-infused superhydrophobic copper oxide surfaces as a platform for condensation enhancement in practical systems were investigated. The condensation heat transfer coefficient on such oil-infused heterogeneous surfaces can be enhanced by approximately 100% compared to state-of-the-art dropwise surfaces in the presence of non-condensables gases. An order of magnitude increase in nucleation density could contribute to approximately 80% increase in the overall heat transfer coefficient. Meanwhile, the low departure radii and low contact angle also assisted in the total improvement. Achieving the three key aspects of condensation simultaneously can be important to realize heat transfer enhancement by as high as 100%. Further work is needed to tailor oil and coating properties, as well as surface geometry to minimize oil loss during operation and maximize condensing surface area. With continued development, immersion condensation promises to be an important condensation mode for a variety of heat transfer and resource conserving applications.

Fabrication

Figure 2A:
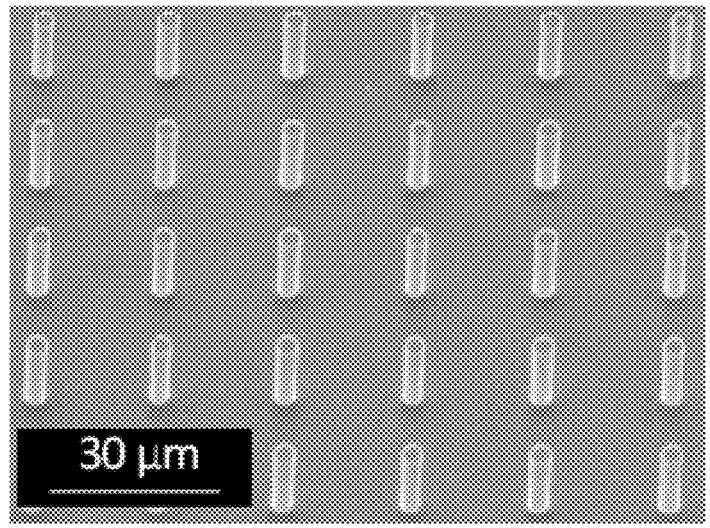
FIGS. 2A and 2B represent micrographs of a patterned surface and a patterned surface including an infused material.
Figure 2B:
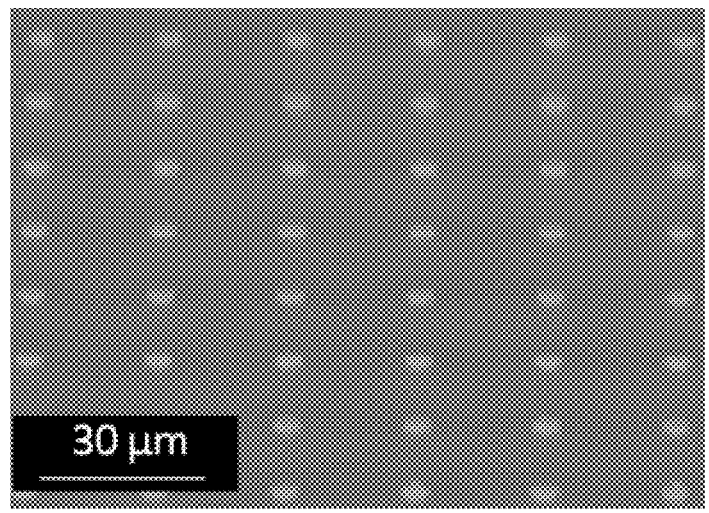

Well-defined silicon micro/nanopillar arrays with diameters, d, ranging from 0.4 µm to 5 µm, periods, l, ranging from 4 µm to 25 µm, and heights, h ranging from 10 µm to 25 µm were used in these experiments. The silicon surfaces were functionalized with three different chemicals: 1) (Tridecafluoro-1,1,2,2-tetrahydrooctyl)-1-trichlorosilane (TFTS) (UCT Specialties), which forms a self-assembled coating (SAC) by chemical vapor deposition (CVD) with a relatively long carbon chain (MW=481.54 g/mol), 2) Dimethyldicholorosilane (DMCS) (Sigma-Aldrich), which forms a self-assembled monolayer (SAM) by CVD with a short carbon chain (MW=129.06 g/mol), and 3) Poly(1H,1H,2H,2H-perfluorodecyl acrylate) (PFDA) polymer, which was deposited using initiated chemical vapor deposition (iCVD) with a typical film thickness of 35 nm. Goniometric measurements on smooth functionalized silicon surfaces showed advancing and receding contact angles of: $\theta_a/\theta_r=122°\pm1.3°/78°\pm1.3°$ (equilibrium contact angle $\theta_e \approx 102.1°\pm0.9°$); $\theta_a/\theta_r=103.8°\pm0.5°/102.7°\pm0.4°$ ($\theta_e \approx 103.2°\pm0.3°$); and $\theta_a/\theta_r=121.1°\pm2.2°/106.3°\pm2.4°$ ($\theta_e \approx 113.5°\pm1.6°$) for deposited films of TFTS, DMCS, and PFDA respectively. A small droplet of Krytox GPL 100 oil (DuPont) was applied to the functionalized silicon pillar arrays. The surface tension of Krytox oil is ~17-19 mN/m, allowing the oil to spread on the surface. A dry nitrogen stream was used to assist spreading and remove excess oil. Typical scanning electron micrographs (SEM) of the silicon pillar arrays without and with the oil are as shown in FIGS. 2A and 2B, which are scanning electron micrographs (SEM) of a pillar-structured silicon surface (d=5 µm, l=25 µm, h=15 µm) (a) without and (b) with the oil infusion.

The nucleation behavior on the surfaces with and without the oil were investigated under white light optical microscopy (OM). The samples were horizontally mounted on a thermal stage (Instec Inc.) inside an enclosure and cooled to $T_w=283.1\pm0.1K$ in a dry nitrogen atmosphere. Following thermal equilibration (~5 min), nucleation was initiated by flowing water-saturated nitrogen into the enclosure. The supersaturation, defined as the ratio of the vapor pressure to the saturation pressure at the stage temperature ($p_v/p_w$), was controlled by the temperature of the water reservoir through which the nitrogen carrier gas was sparged and measured using a humidity probe (Hygroclip, Rotronic) located ~1 cm above the sample. Typical values of the supersaturation were around S≈1.6. The nucleation density and subsequent growth behavior was recorded at a frame rate of 30 fps using a CMOS camera (Phantom V7.1, Vision Research) attached to the optical microscope.

Figure 3A:
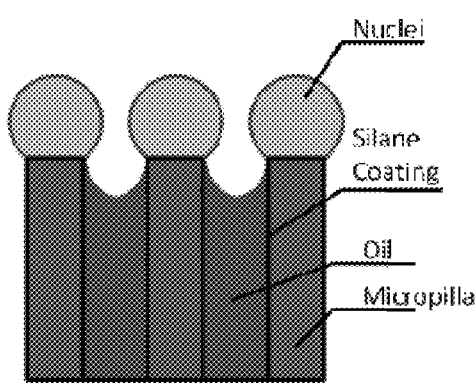
FIGS. 3A to 3D represent a diagram and micrographs of surfaces showing condensation.

Referring to FIG. 3A, a schematic drawing illustrates the nucleation on the oil-infused surface.

Figure 3B:
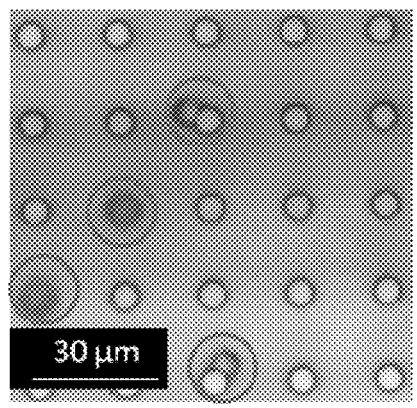
Figure 3C:
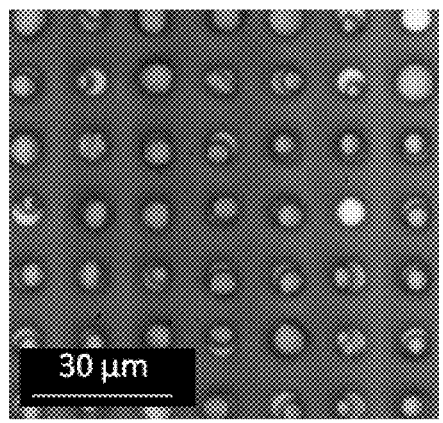
Figure 3D:
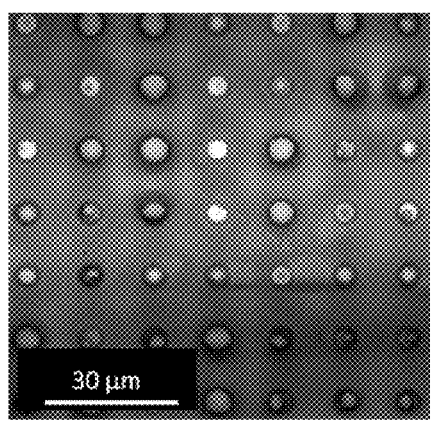

As shown in FIGS. 3B and 3C, the nucleation density on oil-infused surface with long-chain TFTS coating was significantly higher than that on the same surface without oil. Specifically, FIG. 3B represents a white-light microscopy image of condensation on a silicon pillar array without oil, with nucleation sites highlighted by circles. FIG. 3C represents white-light microscopy image of condensation on a composite surface with oil. Nucleation occurred on the tip of almost every pillar. Nucleation between pillars was not observed, which can be attributed to the large thickness of oil coverage between pillars that introduces a large diffusion resistance for water vapor. However, a droplet was formed on the tip of almost each pillar where the oil film was thin enough to allow sufficient mass to diffuse to the functionalized silicon surface. Referring to FIG. 3D, white-light microscopy image highlights the removal of the condensate. The condensate (water in this case) can be easily absorbed into the oil.

Figure 4:
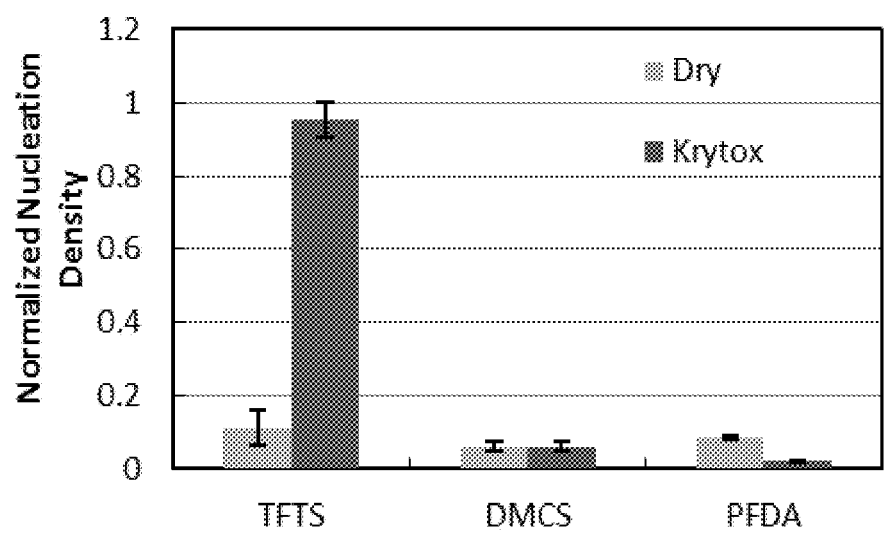
FIG. 4 represents a graph depicting condensation nucleation on surfaces.

Meanwhile, on pillar arrays coated with DMCS and PFDA, similar increases in nucleation density were not observed, as shown in FIG. 4. Specifically, FIG. 4 represents a comparison of the change in nucleation density with various surface coatings. The nucleation densities were normalized against pillar densities for a fair comparison.

AFM Imaging and Contact Angle Analysis

Figure 1B:
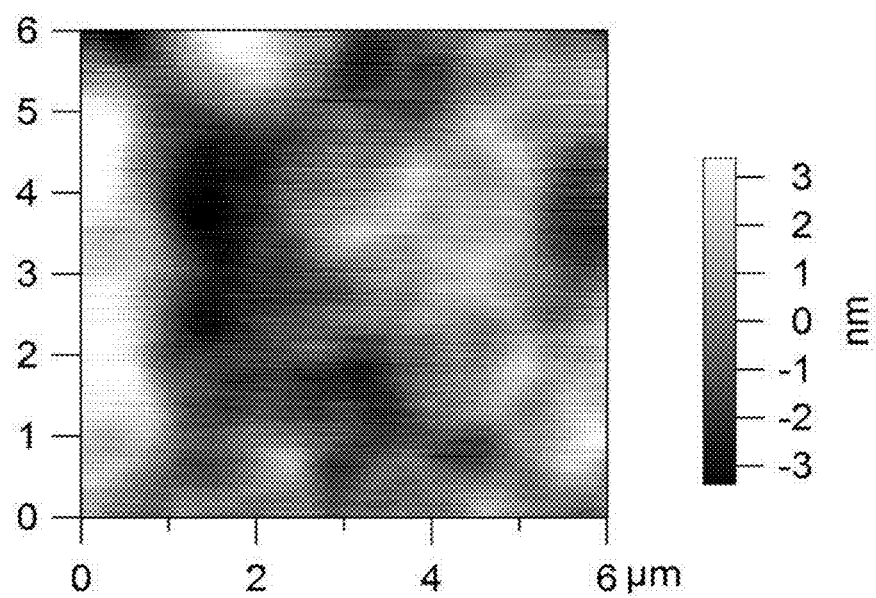
Figure 1C:
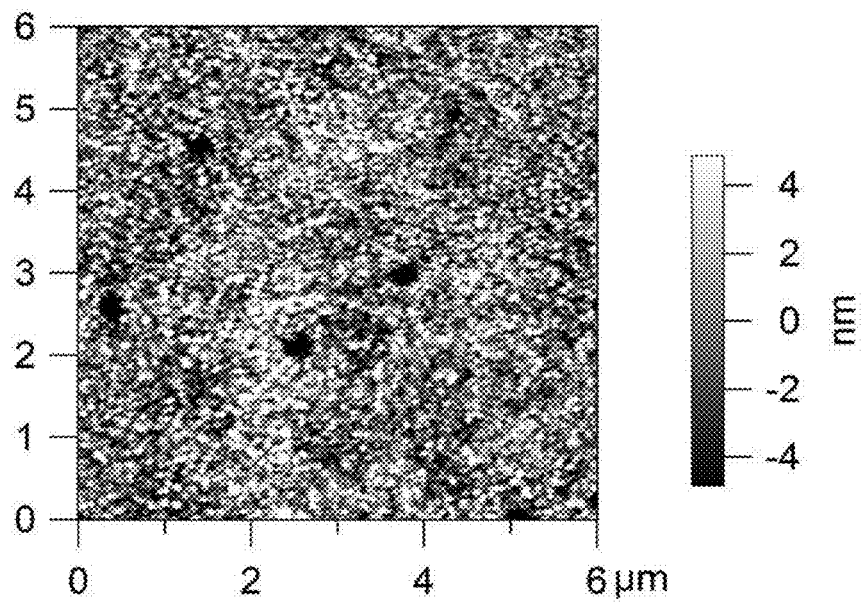
Figure 1D:
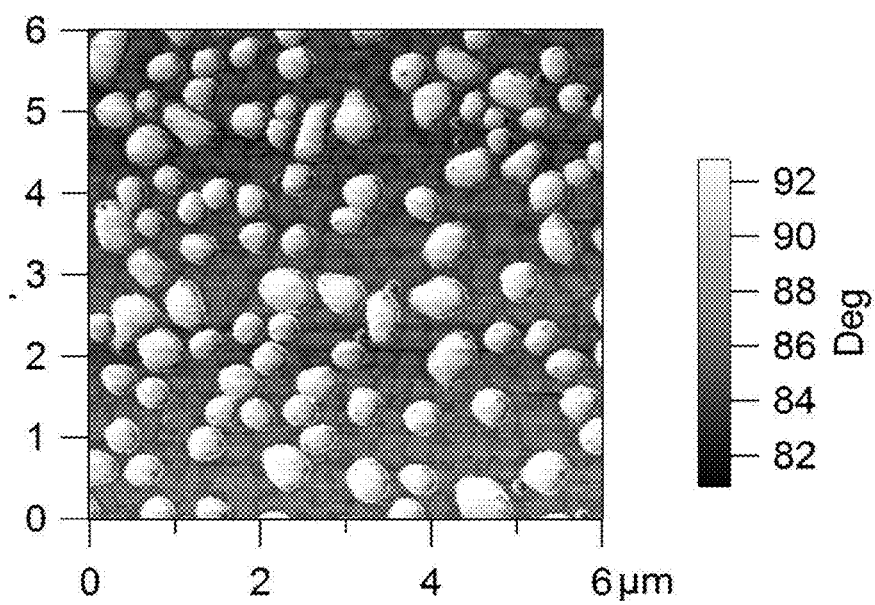

To investigate the mechanism for this drastic change in nucleation density, atomic force microscopy (AFM) was performed in tapping mode on a smooth TFTS-coated silicon surface and observed the presence of micelle structures, as shown in FIG. 1A. Such micelle structures have been observed in previous studies and considered as disordered agglomeration of excessive silane molecules. See, for example, B. C. Bunker, R. W. Carpick, R. A. Assink, M. L. Thomas, M. G. Hankins, J. A. Voigt, D. Sipola, M. P. de Boer, and G. L. Gulley, "The Impact of Solution Agglomeration on the Deposition of Self-Assembled Monolayers", *Langmuir*, 2000, 16 (20), pp 7742-7751, which is incorporated by reference in its entirety. The phase image of the AFM measurement (FIG. 1D) showed significantly higher phase angle on the micelle structures, which suggests that the micelles were locally more hydrophilic compared to the background film. Such heterogeneity was also supported by the high contact angle hysteresis ($\theta_a/\theta_r=122°\pm1.3°/78°\pm1.3°$). However, such micelle structures were not observed on other kinds of surface coatings such as DMCS and PFDA, as shown in FIGS. 1B and 1C. Specifically, FIG. 1 depicts atomic force microscopy (AFM) height images of smooth silicon surfaces coated with (FIG. 1A) TFTS, (FIG. 1B) DMCS, and (FIG. 1C) PFDA. Micelles structures were only observed on TFTS coated surfaces. FIG. 1D depicts AFM phase image of smooth silicon surface coated with TFTS. The local high phase angle indicates higher hydrophilicity of micelles.

The local contact angles on the hydrophobic substrate and the micelle structures can be determined based on a modified Cassie-Baxter model. Assuming the local contact angles on the hydrophobic substrate and the micelle structures to be $\theta_1$ and $\theta_2$, respectively, the macroscopic advancing and receding contact angles are determined as $$\theta_a = \theta_1, \tag{1}$$

$$\cos\theta_r = \sqrt{f}\cos\theta_2 + (1-\sqrt{f})\cos\theta_1, \tag{2}$$

where f is the area fraction of the micelles.

Based on the macroscopically measured advancing and receding angles, $\theta_a=122°\pm1.3°$ and $\theta_r=78°\pm1.3°$, and the fraction of the micelles determined as $f\approx0.4$ from AFM, the local contact angles on the hydrophobic substrate and the hydrophilic micelles were found to be $\theta_1=122°\pm1.3°$ and $\theta_2=60°\pm1.5°$.

Nucleation Theory

The nucleation rate, J, can be determined by classical nucleation theory (CNT) as (D. Kashchiev, *Nucleation: Basic Theory with Applications*. 1 ed. 2000, Oxford: Butterworth-Heinemann, which is incorporated by reference in its entirety)

$$J = zf^* \exp(-G^*) \quad (3)$$

In Eqn. (3), z is the Zeldovich factor and G* is the dimensionless energy barrier, given by $$z = (kT \ln S)^2 / 8\pi v_o \sqrt{kT\psi(\theta) y^2} \quad (4)$$

$$G^* = 16\pi \psi(\theta) v_o^2 y^2 / 3(kT)^2 (\ln S)^2 \quad (5)$$

where S is the supersaturation and $\psi\theta$ is the activity that accounts for the effect of contact angle. f* is the frequency of monomer attachment to the critical droplet nucleus dependent on the nature of the nucleus growth. The main modes of growth during heterogeneous nucleation are limited via surface diffusion or direct impingement of monomers to the nucleus. See, for example, G. M. Pound, M. T. Simnad, and L. Yang, "Heterogeneous nucleation of crystals from vapor" *J. Chem. Phys.*, 1954. 22(1215) and R. A. Sigsbee, "Atom capture and growth rates of nuclei", *JAP*, 1971. 42(10): p. 3904-3915, each of which is incorporated by reference in its entirety. Volumetric diffusion is a third growth limiting step, which is only considered important for nucleation taking place in liquid or solid solutions. See, for example, D. Kashchiev, *Nucleation: Basic Theory with Applications*. 1 ed. 2000, Oxford: Butterworth-Heinemann, which is incorporated by reference in its entirety. However, all three mechanisms were included when calculating the nucleation rates.

The frequency of monomer attachment due to direct vapor impingement is given by $$f^*_I = y_n[(1-\cos(\theta_w))/2\psi^{2/3}(\theta)](36\pi v_o^2)^{1/3} I n^{2/3} \quad (6)$$

where $y_n$ is the sticking coefficient ($0<y_n\leq1$), I is the classical Hertz-Knudsen impingement rate $I=P/\sqrt{2\pi m_o kT}$), n is the number of molecules in the nucleated cluster, and $v_o$ is the volume of an individual water molecule ($v_o=3\times10^{-29}$ m$^3$). To determine an upper bound on the nucleation rate, a sticking coefficient of one was assumed ($y_n=1$).

The frequency of monomer attachment due to surface diffusion is given by $f^*_{sd}=v_n c^* \lambda_s^2 I$, where c* is the capture number due to surface diffusion ($1<c^*<5$), and $\lambda_s$ is the mean surface diffusion distance of an adsorbed monomer on the substrate. The capture number c* is size independent and approximately equal to 1.9 for heterogeneous condensation of water vapor. See, for example, D. J. Pocker, and S. J. Hruska, "Detailed calculations of the number of distinct sites visited in random walk on several two-dimensional substrate lattices." *J. Vac. Sci. Tech.*, 1971. 8(6): p. 700-707, which is incorporated by reference in its entirety. The mean surface diffusion distance is dependent on the wettability of the substrate and is given by $\lambda_s = \sqrt{D_{ad}\tau_d}$ where $D_{sd}$ is the surface diffusion coefficient ($D_{ad}=d_s^2 v_s \exp[-E_{sd}/kT]$), $\tau_d$ is the desorption time ($\tau_d=(1/v_s)\exp[-E_{dss}/kT]$), $v_s$ is the adsorbed molecule vibration frequency determined using the Debye approximation ($v_s=V_D\alpha/2$), $d_s$ is the length of a molecular jump along the substrate surface approximated by the lattice constant of the substrate ($d_s=5.4$ Å) (J. P. Hirth, and G. M. Pound, *Condensation and evaporation—nucleation and growth kinetics*. 1963, England: Pergamon Press, which is incorporated by reference in its entirety) and $V_D$ is the speed of sound in the substrate ($V_D=8433$ m/s). The desorption and surface diffusion energies are given by $E_{des}=E_1+\sigma_{sv}a_o$ and $E_{sd}=0.5E_{des}$ (P. A. Thiel, and T. E. Madey, "The interaction of water with solid surfaces: Fundamental aspects." *Surface Science Reports*, 1987. 7(6-8): p. 211-385, which is incorporated by reference in its entirety), respectively, where $E_1$ is the binding energy of an n=1 sized cluster, $\sigma_{sv}$ is the solid vapour interfacial energy and $a_o$ is the water molecule surface area ($a_o=4.67\times10^{-19}$ m$^2$). The calculated energies of desorption show excellent agreement with that of experiment and molecular dynamics simulations ($E_{des,SiO2}=0.9$ eV). See, for example, J. N. Israelachvili, *Intermolecular and surface forces*. 2nd ed. 1991, Amsterdam: Academic Press and Y. Ma, A. S. Foster, and R. M. Nieminen, "Reactions and clustering of water with silica surface". *J. Chem. Phys.*, 2005. 122(144709), which is incorporated by reference in its entirety.

The frequency of monomer attachment due to volumetric diffusion is given by $$f^*_{vd} = \gamma_n \left(1 - \frac{\cos\theta_W}{\varphi^{1/2}}\right)(6\pi^2 v_o)^{1/2} DCn^{1/2} \quad (7)$$

where D is the self diffusion coefficient of water vapor (D=3/$a\pi n_o d_o^2)\sqrt{kT/\pi m_o}$), C is the equilibrium concentration of monomers (C=$(1/\alpha_o)\exp(-W_1/kT)$), $d_o$, $m_o$ and $n_o$ are the water molecule diameter ($d_o=3.0$ Å) (J. N. Israelachvili, *Intermolecular and surface forces*. 2nd ed. 1991, Amsterdam: Academic Press, which is incorporated by reference in its entirety), mass ($m_o=3\times10^{-26}$ kg) (D. Kashchiev, *Nucleation: Basic Theory with Applications*. 1 ed. 2000, Oxford: Butterworth-Heinemann, which is incorporated by reference in its entirety) and number density ($n_o=N_A/v_M$), respectively.

Figure 5:
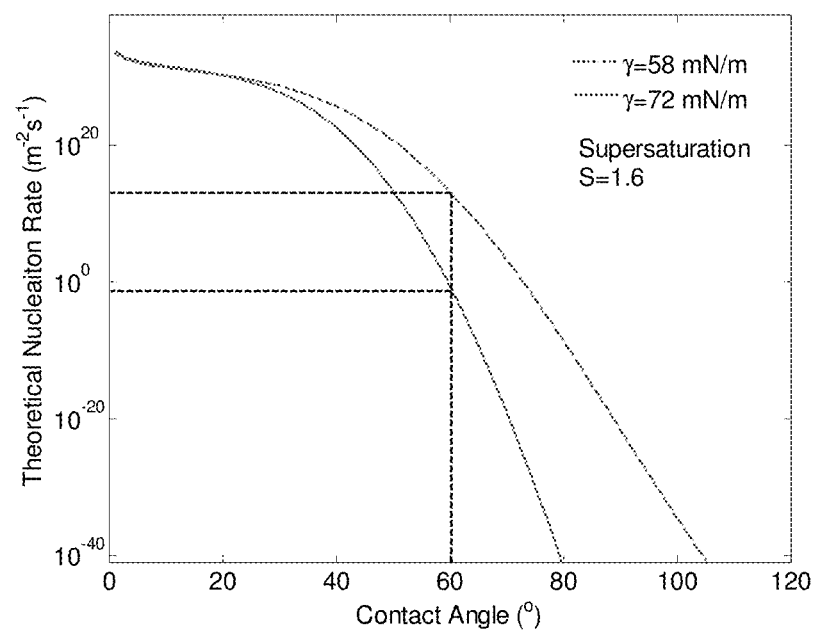
FIG. 5 represents a graph depicting condensation nucleation rates.

By adding the nucleation rate from the three mechanisms together, the nucleation rate, J, can be determined as a function of the contact angle and surface tension of the condensate at given supersaturations, as shown in FIG. 5. FIG. 5 depicts nucleation rate predicted by the classical nucleation theory as a function of contact angle and interfacial tension at S=1.6.

The surface tension of water in air is 72 mN/m and the interfacial tension between water and the Krytox oil was found to be 58 mN/m by measuring the contact angle of water droplet on oil film. From FIG. 5 it can be seen that for the hydrophilic micelles ($\theta\approx60°$), the reduced interfacial tension between water and oil leads to a significant increase in the nucleation rate. With the micelles acting as nucleation sites, nucleation was supposed to occur on almost every pillar tip where the oil film was thin enough for water vapor to diffuse through. On surfaces without the micelles, such as DMCS and PFDA-coated surfaces, the contact angles are over 100° and the nucleation rate was essentially zero even with reduced interfacial tension.

Figure 6A:
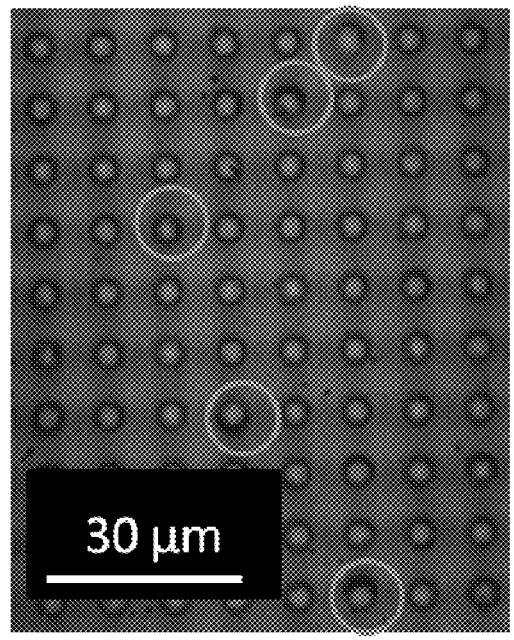
FIGS. 6A and 6B represent micrographs depicting condensation on a patterned surface including an infused material.
Figure 6B:
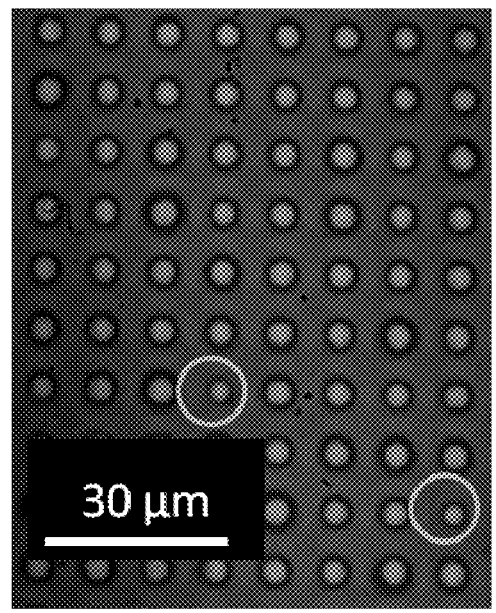

In order to validate this assumption, condensation experiments were carried out using silicon pillar arrays coated with 3-(trimethoxysilyl)propyl methacrylate (3-TMPM). The advancing and receding contact angle of water on a smooth silicon surface coated with 3-TMPM are 65°±1.5° and 53°±1.1°, respectively. The contact angle is in the range where the nucleation rate will be almost zero with a surface tension of 72 mN/m and nucleation should occur on every tip of pillars with an interfacial tension of 58 mN/m. Optical images of the condensation experiments are as shown in FIGS. 6A and 6B. Similar to the behavior of TFTS-coated surface, a significant increase in nucleation density was observed with the addition of Krytox oil as expected. This result supports well the hypothesis related to the role of the hydrophilic micelle structures in the droplet nucleation process. FIGS. 6A and 6B depict optical microscope images of the condensation experiments on 3-TMPM coated silicon pillar arrays (FIG. 6A) without ($N=6.7 \times 10^8$ $m^{-2}$) and (FIG. 6B) with Krytox oil ($N=1.7 \times 10^{10}$ $m^{-2}$). Nuclei are highlighted by circles in FIG. 6A and pillars without nucleation were highlighted by circles in FIG. 6B. The pillars have diameters of 2.5 µm, periods of 7.5 µm and heights of 25 µm ($1^{-2}=1.7 \times 10^{10}$ $m^{-2}$).

Heat Transfer Coefficient

Figure 7:
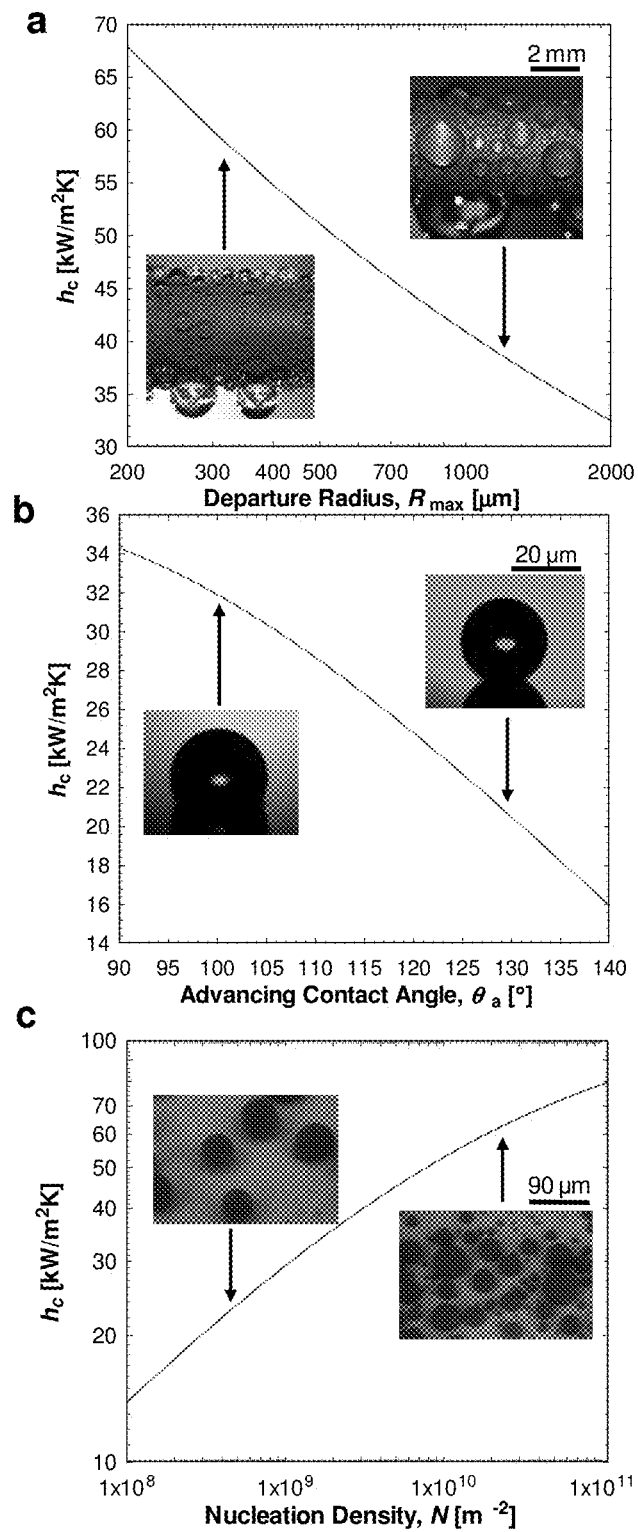
FIGS. 7A to 7C represent a series of graphs and micrographs depicting parameters affecting condensation heat transfer coefficient on a flat surface.

In practice, filmwise condensation, where a thin liquid film covers the surface, is the most prevalent condensation mode due to the high wettability of common heat transfer materials. In this condensation mode, the heat transfer coefficient is limited by the thermal resistance associated with the condensate film which insulates the surface. See Mills, A. F. *Heat and Mass Transfer.* 2 edn, (Prentice-Hall, 1999), which is incorporated by reference in its entirety. Accordingly, efforts spanning eight decades have been devoted to the realization of non-wetting surfaces for dropwise condensation where shedding droplets clear the surface for droplet re-nucleation/re-growth, leading to enhanced heat transfer rates. See Schmidt, E., Schurig, W. & Sellschopp, W. Versuche über die Kondensation von Wasserdampf in Film-und Tropfenform. *Forschung im Ingenieurwesen* 1, 53-63, (1930), Tanner, D. W., Potter, C. J., Pope, D. & West, D. Heat transfer in dropwise condensation—Part I The effects of heat flux, steam velocity and non-condensable gas concentration. *International Journal of Heat and Mass Transfer* 8, 419-426, (1965), O'Neill, G. A. & Westwater, J. W. Dropwise condensation of steam on electroplated silver surfaces. *International Journal of Heat and Mass Transfer* 27, 1539-1549, (1984), Boreyko, J. B. & Chen, C.-H. Self-Propelled Dropwise Condensate on Superhydrophobic Surfaces. *Phys Rev Lett* 103, 184501 (2009), Chen, C.-H. et al. Dropwise condensation on superhydrophobic surfaces with two-tier roughness. *Appl Phys Lett* 90, 173108-173103 (2007), and Le Fevre, E. J. & Rose, J. W. An experimental study of heat transfer by dropwise condensation. *International Journal of Heat and Mass Transfer* 8, 1117-1133, (1965), each of which is incorporated by reference in its entirety. One order of magnitude higher heat transfer coefficients compared to filmwise condensation have been reported using dropwise condensation in pure vapor environments. See Daniel, S., Chaudhury, M. K. & Chen, J. C. Fast Drop Movements Resulting from the Phase Change on a Gradient Surface. *Science* 291, 633-636, (2001), which is incorporated by reference in its entirety. In order to maximize the heat transfer coefficient, a high performance dropwise condensation surface should simultaneously achieve three properties: low contact angle hysteresis to minimize droplet departure radii, low contact angle to reduce the conduction resistance of the droplet, and high nucleation density (see Miljkovic, N., Enright, R. & Wang, E. N. Effect of Droplet Morphology on Growth Dynamics and Heat Transfer during Condensation on Superhydrophobic Nanostructured Surfaces. *Acs Nano* 6, 1776-1785, (2012), which is incorporated by reference in its entirety), as shown in FIG. 7. Recently, investigations have focused on understanding how chemically modified micro/nanostructured surfaces can achieve superhydrophobicity to allow droplets in a stable Cassie wetting state (see Cassie, A. B. D. & Baxter, S. Wettability of porous surfaces. *T Faraday Soc* 40, 0546-0550, (1944), which is incorporated by reference in its entirety), which further improves droplet mobility and reduces the departure radii (FIG. 7A). See Enright, R., Miljkovic, N., Al-Obeidi, A., Thompson, C. V. & Wang, E. N. Condensation on Superhydrophobic Surfaces: The Role of Local Energy Barriers and Structure Length Scale. *Langmuir* 28, 14424-14432, (2012) and Rykaczewski, K. et al. How nanorough is rough enough to make a surface superhydrophobic during water condensation? *Soft Matter* 8, 8786-8794 (2012), each of which is incorporated by reference in its entirety. In certain cases, these surfaces enable surface-tension-driven droplet jumping at micron length scales. See Miljkovic, N. et al. Jumping-Droplet-Enhanced Condensation on Scalable Superhydrophobic Nanostructured Surfaces. *Nano Lett* 13, 179-187, (2012), which is incorporated by reference in its entirety. However, this focus on increasing the apparent hydrophobicity to reduce droplet departure radii does not necessarily address the other two aspects influencing condensation heat transfer rates. The high apparent contact angles of condensing droplets on superhydrophobic surfaces lead to an increase in the conduction resistance through the droplet (see Kim, S. & Kim, K. J. Dropwise Condensation Modeling Suitable for Superhydrophobic Surfaces. *Journal of Heat Transfer* 133, 081502 (2011), which is incorporated by reference in its entirety), hindering the overall heat transfer performance (FIG. 7B). Moreover, the Cassie wetting state introduces a vapor layer beneath the condensate droplet, which significantly increases the thermal resistance. In addition, hydrophobic surface chemistry increases the nucleation thermodynamic energy barrier, thus reducing the nucleation density and limiting the heat transfer coefficient (FIG. 7C). See Kashchiev, D. *Nucleation: Basic Theory with Applications.* 1 edn, (Oxford: Butterworth-Heinemann, 2000), which is incorporated by reference in its entirety. Hydrophobic structured surfaces with well-defined hydrophilic sites on the roughness features have also been explored to control the nucleation density (see Varanasi, K. K., Hsu, M., Bhate, N., Yang, W. & Deng, T. Spatial control in the heterogeneous nucleation of water. *Appl Phys Lett* 95, 094101-094101-094103 (2009), which is incorporated by reference in its entirety), but strong droplet adhesion on such surfaces is likely to limit their applicability for condensation heat transfer enhancement. More recently, composite surfaces have been proposed whereby hydrophobic structured surfaces were infused with oil to simultaneously achieve easy droplet removal and low contact angles. See Wong, T.-S. et al. Bioinspired self-repairing slippery surfaces with pressure-stable omniphobicity. *Nature* 477, 443-447 (2011) and Anand, S., Paxson, A. T., Dhiman, R., Smith, J. D. & Varanasi, K. K. Enhanced Condensation on Lubricant Impregnated Nanotextured Surfaces. *Acs Nano*, (2012), each of which is incorporated by reference in its entirety. During condensation, two-tier surface roughness was shown to enhance the removal of droplets suspended on top of the infused oil layer. While these works showed significant potential for enhanced condensation surfaces, achieving high nucleation densities has not previously been considered. Furthermore, experimentally obtained heat transfer enhancements with such surfaces have not been reported.

Figure 8:
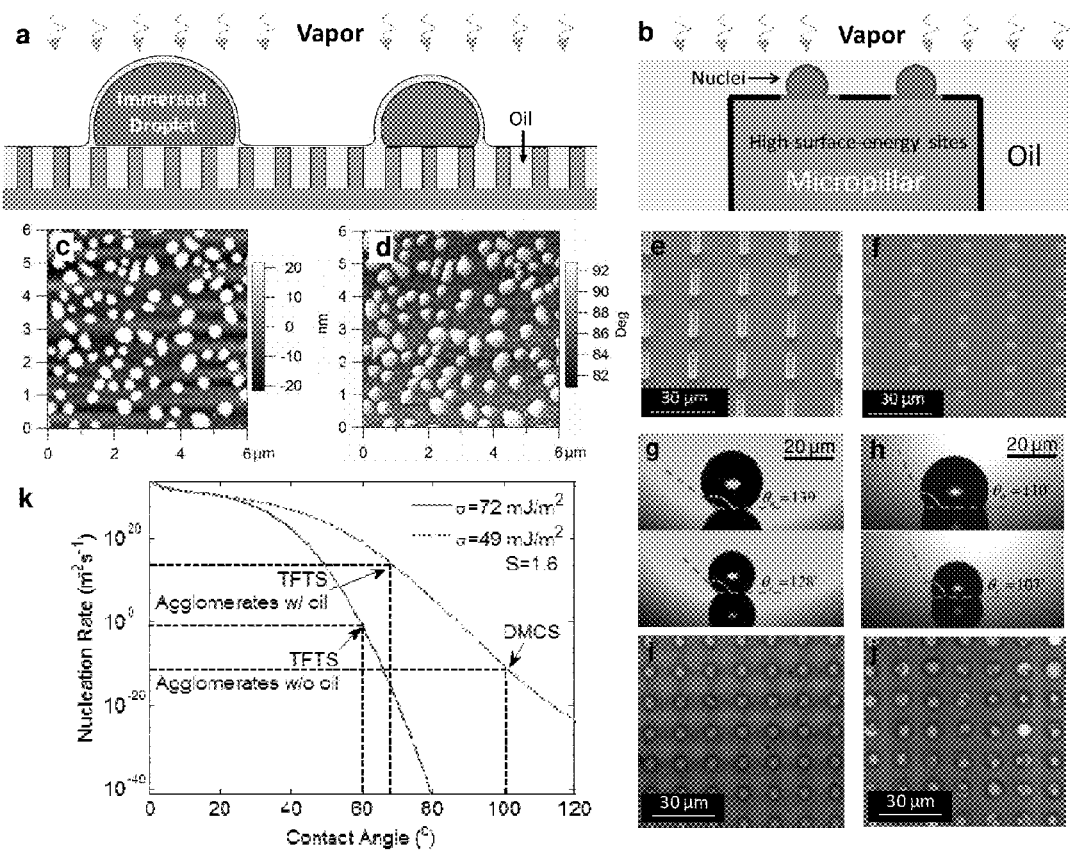
FIGS. 8A to 8K represent diagrams, micrographs, and a graph depicting mechanism of immersion condensation.

Immersion condensation, a new approach to enhance condensation heat transfer by introducing heterogeneous surface chemistry composed of discrete hydrophilic domains on a hydrophobic background in oil-infused micro and nanostructured surfaces is disclosed. This approach allows water droplets to nucleate immersed within the oil to achieve high nucleation densities while maintaining easy droplet removal and low contact angles (FIGS. 8A and 8B). In contrast to the same surface not infused with oil, nucleation densities were one order of magnitude larger due to the combined effect of the high-surface-energy sites and the reduced oil-water interfacial energy which, together, lower the thermodynamic energy barrier for stable nuclei formation. Meanwhile, the contact angle hysteresis was as low as 3° and the droplet apparent contact angle was ≈110°. The immersion of droplets in the presence of the heterogeneous coating is demonstrated to be essential to the high water nucleation densities and achieving significant heat transfer enhancements. The heterogeneous coating on flat silicon surfaces using AFM is characterized for the first time. The scans showed the presence of discrete high-surface-energy sites on a low-surface-energy background. Well-defined micropillar arrays were subsequently coated and then infused with oil to study the physics of condensation behavior. Finally, heat transfer enhancements of approximately 100% with oil-infused, heterogeneously coated copper oxide nanostructured surfaces in comparison with state-of-the-art dropwise condensing surfaces is demonstrated, which suggests the practicality of this invention. This work promises the development of a scalable strategy for highly efficient condensation heat transfer for industrial, building energy, electronics cooling, and water-harvesting applications.

Surface Heterogeneity by Self-Assembled Coatings

A self-assembled coating (SAC) of (tridecafluoro-1,1,2,2-tetrahydrooctyl)-1-trichlorosilane (TFTS) was deposited from the vapor phase (See Methods for the deposition process). The SAC coating method is capable of forming heterogeneity by agglomeration. See Bunker, B. C. et al. The Impact of Solution Agglomeration on the Deposition of Self-Assembled Monolayers. *Langmuir* 16, 7742-7751, (2000), which is incorporated by reference in its entirety. The SAC method was chosen due to its simplicity and scalability, but alternative methods are also available to generate heterogeneity at the appropriate length scale, e.g., block copolymer or nano-imprinting. See Park, M., Harrison, C., Chaikin, P. M., Register, R. A. & Adamson, D. H. Block Copolymer Lithography: Periodic Arrays of ~1011 Holes in 1 Square Centimeter. *Science* 276, 1401-1404, (1997) and Guo, L. J., Cheng, X. & Chou, C.-F. Fabrication of Size-Controllable Nanofluidic Channels by Nanoimprinting and Its Application for DNA Stretching. *Nano Lett* 4, 69-73, (2003), each is which is incorporated by reference in its entirety. Height and phase atomic force microscope (AFM) images of the TFTS coating on a smooth silicon surface were obtained and are shown in FIGS. 8C and 8D, respectively, where the white spots are the nanoscale agglomerates of TFTS (≈200-500 nm in diameter). The phase angle of the agglomerates was significantly higher than that of the background, indicating that the agglomerates have higher surface energy. See James, P. J. et al. Interpretation of Contrast in Tapping Mode AFM and Shear Force Microscopy. A Study of Nafion. *Langmuir* 17, 349-360, (2000), which is incorporated by reference in its entirety. The local contact angle of water on the high-surface-energy agglomerates was determined to be 60°±1.5° by measuring the advancing and receding contact angle of a water droplet on the smooth, coated surface in air ($\theta_a/\theta_r=122°\pm1.3°/78°\pm1.3°$) and interpreting the data using a modified Cassie-Baxter model that incorporates the effect of local contact line deformation. See Raj, R., Enright, R., Zhu, Y., Adera, S. & Wang, E. N. A Unified Model for Contact Angle Hysteresis on Heterogeneous and Superhydrophobic Surfaces. *Langmuir*, (2012), which is incorporated by reference in its entirety.

Immersion Condensation on Silicon Micropillars

The SAC was deposited on silicon micropillar arrays to fundamentally investigate nucleation behavior on oil-infused surfaces. Silicon micropillar arrays were fabricated with diameters, d, ranging from 0.4-5 μm, periods, l, ranging from 4-25 μm, and heights, h, ranging from 10-25 μm using contact lithography and deep reactive ion etching (DRIE) processes. The geometries were chosen to satisfy the imbibition condition to enable oil spreading and to stabilize the oil film. See Bico, J., Thiele, U. & Quéré, D. Wetting of textured surfaces. *Colloids and Surfaces A: Physicochemical and Engineering Aspects* 206, 41-46, (2002), which is incorporated by reference in its entirety. The pillar surfaces were subsequently functionalized with the TFTS SAC, and infused with a fluorinated oil, Krytox GPL 100. The low surface tension of Krytox oil (≈17-19 mN/m) allowed it to spread on the surface and form a stable film via capillarity. A dry $N_2$ stream was used to assist spreading and remove excess oil. Typical scanning electron microscope (SEM) images of the coated pillar arrays without and with oil-infusion are shown in FIGS. 8E and 8F, respectively. On these TFTS-coated pillar arrays, the advancing and receding contact angles without oil-infusion were $\theta_a/\theta_r=139°\pm3°/128°\pm3°$, whereas those with oil-infusion were $\theta_a/\theta_r=110°\pm2°/107°\pm2°$ (FIGS. 8G and 8H). Such low contact angle hysteresis is a key attribute for allowing droplets to be removed with a small departure radius under gravity during condensation. See Dimitrakopoulos, P. & Higdon, J. J. L. On the gravitational displacement of three-dimensional fluid droplets from inclined solid surfaces. *Journal of Fluid Mechanics* 395, 181-209, (1999), which is incorporated by reference in its entirety. FIGS. 8I and 8J show white light optical microscope images comparing the drastic difference in nucleation density during condensation without and with oil-infusion on the TFTS-coated micropillar arrays, respectively (see Methods for the experimental procedure). Under the prescribed supersaturation of S=1.6 ($S=p_v/p_w$ where $p_v$ is the water vapor pressure and $p_w$ is the water saturation pressure associated with the surface temperature), nucleation was rarely observed on the surface without oil-infusion (nucleation density N≈(4±2)×10$^8$ m$^{-2}$) (FIG. 8I), but was observed on every tip of the pillars after oil-infusion (nucleation density N≈(4.4±0.2)×10$^9$ m$^{-2}$) (FIG. 8J). Nucleation in the space between the pillars was not observed due to the large thickness of oil coverage that limits water vapor diffusion to the SAC. Meanwhile, nucleation on the oil/vapor interface did not occur due to the low interfacial energy.

The increase in nucleation density on the oil-infused TFTS surfaces was achieved via the combination of the high-surface-energy sites and reduced water-oil interfacial energy. Based on classical nucleation theory, the nucleation rate can be determined as a function of the contact angle and the surface energy of the condensate at a given supersaturation, as shown in FIG. 8K). See Blander, M. & Katz, J. L. Bubble Nucleation in Liquids. *Aiche Journal* 21, 833-848, (1975), J. P. Hirth & G. M. Pound. *Condensation and evaporation—nucleation and growth kinetics* (England: Pergamon Press, 1963), and Pound, G. M., Simnad, M. T. & Yang, L. Heterogeneous Nucleation of Crystals from Vapor. *The Journal of Chemical Physics* 22, 1215-1219 (1954), each of which is incorporated by reference in its entirety. On the oil-infused surface, the tips of the pillars were covered by oil due to its low surface tension. However, the tips were still visible in the SEM images (FIG. 8F) because of the small thickness of the oil film. In these regions, the water vapor is able to diffuse through the thin oil layer and form nuclei immersed in the oil layer on the high-surface-energy sites. The critical sizes of nuclei (<10 nm) were much smaller than the sizes of the high-surface-energy sites (≈200-500 nm) so that the local contact angles of the nuclei are only determined by the high-surface-energy sites. With the introduction of oil, the local contact angle of nuclei on those high-surface-energy domains can be bounded in the range from 43° to 67° using Young's equation (see Supporting Information). As a result, the energy threshold for nucleation was significantly decreased due the low local contact angle, in combination with the reduced interfacial energy between water and oil (≈49 mJ/m$^2$) compared to that between water and vapor (≈72 mJ/m$^2$). See Anand, S., Paxson, A. T., Dhiman, R., Smith, J. D. & Varanasi, K. K. Enhanced Condensation on Lubricant Impregnated Nanotextured Surfaces. *Acs Nano*, (2012), which is incorporated by reference in its entirety. Accordingly, as shown in FIG. 8K, assuming a local contact angle lower than 67°, the predicted nucleation rate increases from 0.2 m$^{-2}$s$^{-1}$ to greater than 10$^{14}$ m$^{-2}$s$^{-1}$ due to the encapsulating oil phase in comparison with the same surface without oil-infusion. The oil encapsulation is essential in reducing the energy barrier for nuclei formation and enhancing nucleation density, which is distinct from previous work where the encapsulating oil phase was considered as unfavorable for condensation. The calculated nucleation rate allows the nucleation density to be orders of magnitude larger than the density of the high-surface energy domains. As a result, multiple nuclei could form on each tip of the pillars where the oil layer is thin enough for effective vapor diffusion. However, due to the resolution limits of the imaging experiments, only a single droplet was apparent on each pillar tip. Therefore, only an order of magnitude increase in the observed nucleation density was determined, which was equal to the density of the pillars (FIG. 8J). Control condensation experiments on oil-infused micropillar arrays with dimethyldicholorosilane (DMCS) were also performed, which is a homogeneous hydrophobic coating with advancing and receding contact angles of $\theta_a/\theta_r$=103.8°±0.5°/102.7°±0.4°. No observable change in nucleation density was found after oil-infusion on the DMCS coated surfaces, as predicted by theory (FIG. 8K). These results further support the idea that a high performance condensation surface can be achieved through the combination of local high-surface-energy sites and oil-infusion, which has not been demonstrated previously. However, the overall surface needs to be hydrophobic to prevent the spreading of the condensate beneath the oil film and maintain easy droplet removal. Otherwise, the condensate would wet the substrate, disrupting the oil film and resulting in droplet pinning.

Immersion Condensation on Scalable Copper Oxide Nanostructures

Figure 9:
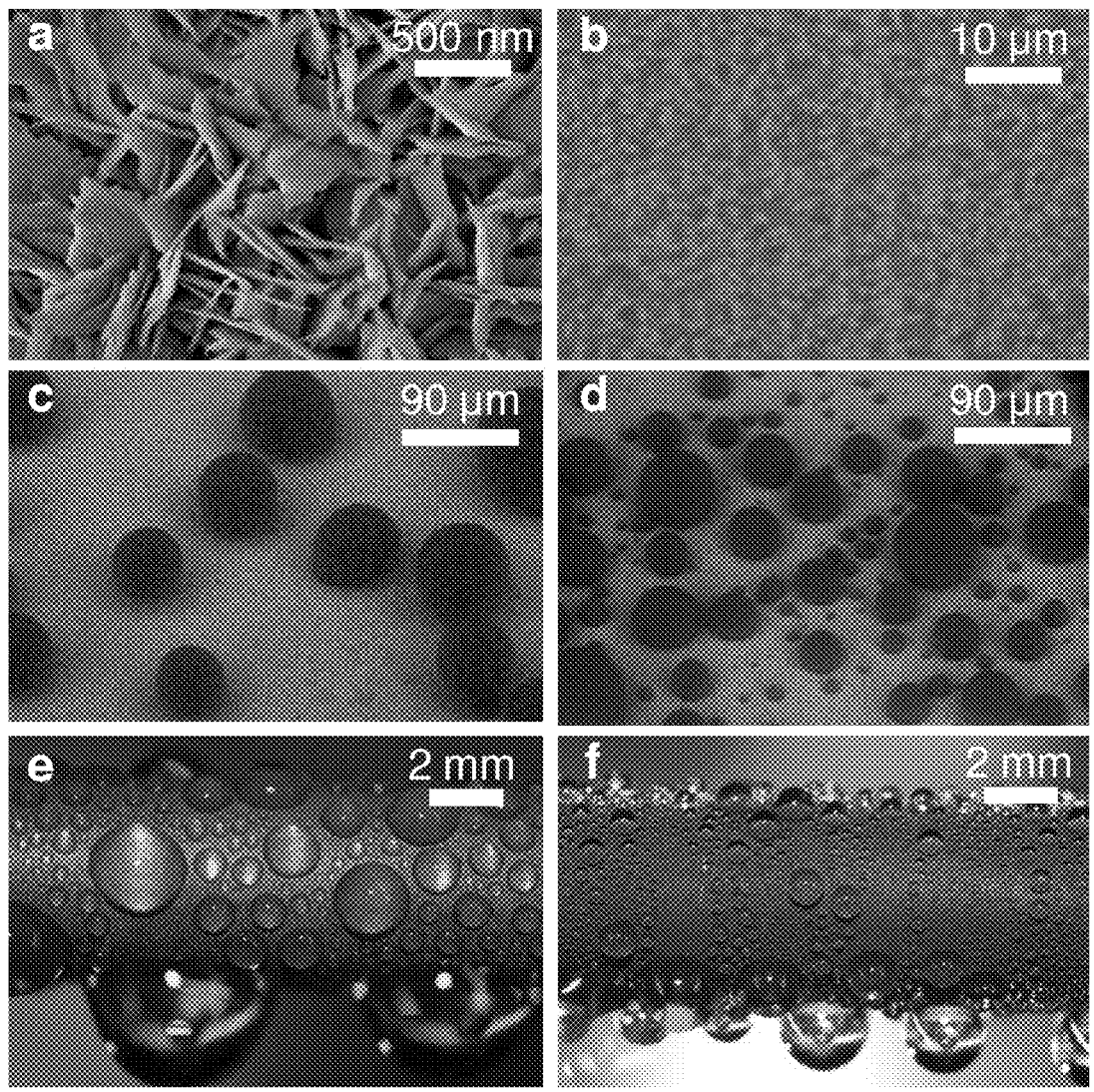
FIGS. 9A to 9D are micrographs depicting scalable copper oxide surfaces for immersion condensation.
FIGS. 9E and 9F are photographs depicting dropwise condensation on copper oxide surfaces.

The overall heat transfer performance of an immersion condensation surface is disclosed. While studies on well-defined silicon micropillar arrays can provide physical insight into immersion condensation behavior, they are not practical due to cost and challenges in interfacing the silicon substrate and the heat transfer measurement apparatus with minimum uncertainties. Therefore, immersion condensation heat transfer measurements on oil-infused copper oxide (CuO) nanostructures functionalized with TFTS was performed, which promises a scalable, low cost platform for condensation surfaces. See Nam, Y. & Ju, Y. S. Comparative Study of Copper Oxidation Schemes and Their Effects on Surface Wettability. *ASME Conference Proceedings* 2008, 1833-1838 (2008), which is incorporated by reference in its entirety. SEM images of representative copper oxide nanostructures without and with Krytox oil-infusion are shown in FIGS. 9A and 9B, respectively. Condensation experiments were performed on the CuO surfaces without and with oil-infusion in an environmental SEM with 1<S<1.29 for visualization (see Methods for detailed imaging process). The FIGS. 9C and 9D show an order of magnitude increase in nucleation density on the oil-infused surface, as similarly observed on the silicon-based microstructures. To capture the condensation heat transfer behavior the oil-infused heterogeneous CuO surfaces were formed on copper tubes (see Methods for detailed fabrication process). FIGS. 9E and 9F show condensation on a typical dropwise hydrophobic surface and an oil-infused heterogeneous immersion condensation surface, respectively. Significantly higher droplet densities were observed on the oil-infused surface. Meanwhile, the average shedding radius of droplets was reduced from R$_{DHP}$=1.83±0.31 mm on the typical dropwise hydrophobic surfaces to R$_{IC}$=0.98±0.13 mm on the immersion condensation surfaces (see Supporting Information for details on determining the droplet shedding radii). Prior to droplet departure, the droplets grew orders of magnitude larger than the characteristic length scale of the nanostructures, thus high apparent contact angles of the droplet (≈110°) were observed, consistent with the low surface energy of the solid-oil composite surface.

Figure 10:
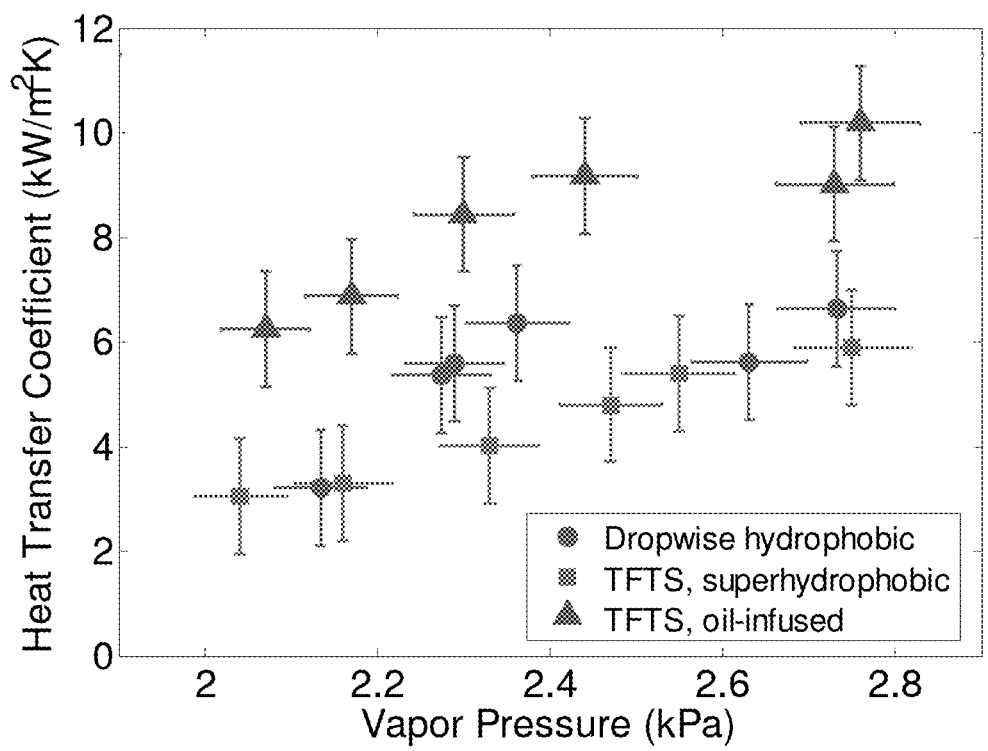
FIG. 10 is a graph depicting experimental immersion condensation heat transfer measurement.

Overall heat transfer coefficients were measured to evaluate the performance on three different CuO-based surfaces: a hydrophobic surface for typical dropwise condensation, a superhydrophobic TFTS-coated copper oxide surface, and a Krytox oil-infused, TFTS-coated CuO surface (FIG. 10) (see Methods for detailed experimental process). The Krytox GPL 100 oil evaporates completely when the test chamber is evacuated to pressures lower than 1 Pa. Therefore, the initial chamber pressure was set as high as 30 Pa (primarily composed of non-condensable gases, NCG) to avoid the evaporation of oil with steam pressures ranging from 2 to 3 kPa (1<S<1.6) in the experiments. This is consistent with actual condenser systems where NCG partial pressures are typically found in the range of 30 Pa and significantly affect the condensation heat transfer performance. See Rose, J. W. Dropwise condensation theory and experiment: A review. *Proceedings of the Institution of Mechanical Engineers, Part A: Journal of Power and Energy* 216, 115-128, (2002), Denny, V. E. & Jusionis, V. J. Effects of noncondensable gas and forced flow on laminar film condensation. *International Journal of Heat and Mass Transfer* 15, 315-326, (1972), Sparrow, E. M., Minkowycz, W. J. & Saddy, M. Forced convection condensation in the presence of noncondensables and interfacial resistance. *International Journal of Heat and Mass Transfer* 10, 1829-1845, (1967), and Tanner, D. W., Pope, D., Potter, C. J. & West, D. Heat transfer in dropwise condensation at low steam pressures in the absence and presence of non-condensable gas. *International Journal of Heat and Mass Transfer* 11, 181-190, (1968), each of which is incorporated by reference in its entirety. Accordingly, with these experimental conditions, a more realistic condensation environment and demonstrate the practical significance of the immersion condensation mode was emulated. While the superhydrophobic surface is more hydrophobic than the typical dropwise hydrophobic surface, flooding and strong pinning of the condensate was observed due to the high supersaturation conditions (S as high as 1.6), leading to similar heat transfer coefficients with the typical dropwise hydrophobic surfaces. Note that these results are distinct from previous literature where jumping of droplets on superhydrophobic surfaces increased heat transfer coefficients at lower saturation conditions (S<1.12). See Miljkovic, N. et al. Jumping-Droplet-Enhanced Condensation on Scalable Superhydrophobic Nanostructured Surfaces. *Nano Lett* 13, 179-187, (2013), which is incorporated by reference in its entirety. In addition, the overall heat transfer coefficients on DHP surfaces in this work (h≈2-7 kW/m²K) are much lower compared to pure vapor conditions (h≈12-13 kW/m²K) due to the presence of NCGs acting as a diffusion barrier to the transport of water vapor towards the condensing surface. In comparison to the typical hydrophobic surfaces, the Krytox oil-infused TFTS-coated CuO surface demonstrated approximately a 100% improvement in heat transfer coefficient over the entire range of supersaturations tested (1<S<1.6) with the existence of NCGs. While the available condensation area was reduced due to the significant oil coverage, the significant improvement in the overall heat transfer coefficient highlights the collective role of enhanced nucleation density, more frequent droplet removal, and lower droplet contact angle (FIG. 7).

Methods

Surface Fabrication

The silicon micropillar arrays were fabricated using contact lithography followed by deep reactive ion etching. For copper oxide surfaces, commercially available oxygen-free Cu tubes (99.9% purity) with outer diameters, $D_{OD}$=6.35 mm, inner diameters, $D_{ID}$=3.56 mm, and lengths L=131 mm as the test samples were used for the experiments. Each Cu tube was cleaned in an ultrasonic bath with acetone for 10 minutes and rinsed with ethanol, isopropyl alcohol and de-ionized (DI) water. The tubes were then dipped into a 2.0 M hydrochloric acid solution for 10 minutes to remove the native oxide film on the surface, then triple-rinsed with DI water, and dried with clean nitrogen gas.

Nanostructured CuO films were formed by immersing the cleaned tubes into a hot (96±3° C.) alkaline solution composed of NaClO₂, NaOH, Na₃PO₄.12H₂O, and DI water (3.75:5:10:100 wt. %). See Enright, R., Dou, N., Miljkovic, N., Nam, Y. & Wang, E. N. Condensation on Superhydrophobic Copper Oxide Nanostructures. *3rd Micro/Nanoscale Heat & Mass Transfer International Conference* (2012), which is incorporated by reference in its entirety. During the oxidation process, a thin (<200 nm) Cu₂O layer was formed that then re-oxidized to form sharp, knife-like CuO structures with heights of h≈1 μm, solid fraction ϕ≈0.023 and roughness factor r≈10. To verify the independence of oxide thickness on chemical oxidation time (see Nam, Y. & Ju, Y. S. Comparative Study of Copper Oxidation Schemes and Their Effects on Surface Wettability. *Imece* 2008: *Heat Transfer, Fluid Flows, and Thermal Systems, Vol* 10, *Pts a-C*, 1833-1838 (2009), which is incorporated by reference in its entirety), four separate samples were made using oxidation times, τ=5, 10, 20, and 45 minutes. The sharp CuO structures were then coated with silane SAC to create SHP surfaces.

In addition to SHP surfaces, cleaned copper tubes were also immersed into hydrogen peroxide solutions at room temperature to form a thin smooth layer of Cu₂O. The smooth surfaces were also coated with TFTS to achieve typical hydrophobic surfaces for dropwise condensation (DHP).

Surface Coating Deposition

The self-assembled coatings (SAC) were formed using a vapor deposition process. First, the silicon surfaces were cleaned using a Piranha solution (H₂O₂:H₂SO₄=1:3) to remove possible organic contamination and to create a large number of —OH bonds on the surface, which enables the bonding between silane molecules and the silicon surface. For the copper oxide surfaces, the surfaces were cleaned by intensive plasma (≈1 hr). The samples were then placed in a desiccator (Cole-Palmer) together with a small petri dish containing ≈1 mL of the silane liquid. The desiccator was pumped down to ≈10 kPa. The pump was then shut off and the valve was closed so that the silane liquid could evaporate in the low-pressure environment of the desiccator and attach to the surfaces to form the SAC via the following reaction,

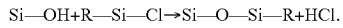

Si—OH+R—Si—Cl→Si—O—Si—R+HCl.

During the self-assembly process, the silane molecule form nanoscale agglomerates with diameters of ≈200-500 nm shown in FIGS. 8C and 8D, as reported previously. See Bunker, B. C. et al. The Impact of Solution Agglomeration on the Deposition of Self-Assembled Monolayers. *Langmuir* 16, 7742-7751, (2000), which is incorporated by reference in its entirety. After 30 minutes of reaction, the desiccator was vented and the samples were rinsed using de-ionized (DI) water. Such vapor deposition process was used for both TFTS and Dimethyldicholorosilane (DMCS) coatings, but in dedicated desiccators to avoid cross-contamination of the different silane molecules.

Surface Characterization

Advancing and receding contact angles for all samples were measured and analyzed using a micro-goniometer (MCA-3, Kyowa Interface Science Co., Japan). Field emission electron microscopy was performed on a Zeiss Ultra Plus FESEM (Carl Zeiss GMBH) at an imaging voltage of 3 kV.

OM Imaging Procedure

The samples were horizontally mounted on a thermal stage inside an enclosure and cooled to $T_w$=283.1±0.1 K in a dry nitrogen atmosphere. Following thermal equilibration (≈5 minutes), nucleation was initiated by flowing water-saturated nitrogen into the enclosure. The humidity of the gas flow was measured using a humidity probe located 1 cm above the sample to determine the supersaturation, S, defined as the ratio of the vapor pressure to the saturation pressure at the stage temperature (S=$p_v/p_w$). Typical values of supersaturation were S≈1.6. The nucleation density and subsequent growth behavior was recorded at a frame rate of 10 frames per second using a high speed camera (Phantom V7.1, Vision Research) attached to the optical microscope. The observable nucleation density during each experiment was determined by counting the number of nuclei in the captured images and dividing the number of nuclei by the imaging area. Multiple experiments were performed to determine the average nucleation densities on the different surfaces.

ESEM Imaging Procedure

Condensation nucleation and growth were studied on these fabricated surfaces using an environmental scanning electron microscope (EVO 55 ESEM, Carl Zeiss GMBH). Backscatter detection mode was used with a high gain. The water vapor pressure in the ESEM chamber was 800±80 Pa. Typical image capture was obtained with a beam potential of 20 kV and variable probe current depending on the stage inclination angle. To limit droplet heating effects, probe currents were maintained below 2.0 nA and the view area was kept above 400 μm×300 μm. See Rykaczewski, K., Scott, J. H. J. & Fedorov, A. G. Electron beam heating effects during environmental scanning electron microscopy imaging of water condensation on superhydrophobic surfaces. *Appl Phys Lett* 98 (2011), which is incorporated by reference in its entirety. A 500 μm lower aperture was used in series with a 100 μm variable pressure upper aperture to obtain greater detail. The sample temperature was initially set to 4±1.5° C. and was allowed to equilibrate for 5 minutes. The surface temperature was subsequently decreased to 3±1.5° C., resulting in nucleation of water droplets on the sample surface. Accordingly, the supersaturation, S, during the imaging process was in the range of 1<S<1.29. Images and recordings were obtained at an inclination angle of 45° from the horizontal to observe droplet growth. Cu tape was used for mounting the sample to the cold stage to ensure good thermal contact.

Heat Transfer Measurements

The test samples, 6.35 mm diameter tubes with different surface treatments, were placed in an environmental chamber (Kurt J. Lesker) for the heat transfer measurements. A water reservoir, which was connected to the chamber via a vapor valve, was heated to >95° C. to produce steam. The vapor valve was opened to allow steam to flow into the chamber after the chamber was pumped down to the targeted non-condensable pressure (≈30 Pa). Chilled water flowed along the inside of the tube where the inlet temperature and outlet temperature were both measured by thermocouples so that the heat flux could be determined by the temperature rise. The temperature difference, ΔT was determined as the log-mean temperature difference (LMTD) between the vapor and the chilled water. Each data point in FIG. 10 was determined over 10 minutes of steady state operation. The vapor inflow valve was then adjusted to change the vapor pressure in the chamber.

Parameters Affecting the Condensation Heat Transfer Coefficient

Based on the model developed by Miljkovic et al. (Miljkovic, N.; Enright, R.; Wang, E. N., Effect of Droplet Morphology on Growth Dynamics and Heat Transfer during Condensation on Superhydrophobic Nanostructured Surfaces. *Acs Nano* 2012, 6 (2), 1776-1785, which is incorporated by reference in its entirety), on a dropwise condensation surface, the heat transfer rate through a single growing droplet can be determined as $$q = \frac{\Delta T}{R_{tot}} = \frac{\pi R^2 \left(\Delta T - \frac{2T_{sat}\sigma}{Rh_{fg}\rho_w}\right)}{\frac{1}{2h_i(1-\cos\theta)} + \frac{R\theta}{4k_w\sin\theta} + \frac{1}{k_{HC}\sin^2\theta}\left[\frac{k_p\phi}{\delta_{HC}k_p + hk_{HC}} + \frac{k_w(1-\phi)}{\delta_{HC}k_w + hk_{HC}}\right]^{-1}} \quad (8)$$

where $R_{tot}$ is the total thermal resistance through the droplet, R is the droplet radius, $\rho_w$ is the liquid water density, $h_{fg}$ is the latent heat of vaporization, $T_{sat}$ is the vapor saturation temperature, σ is the water surface tension, ΔT is the temperature difference between the saturated vapor and substrate ($T_{sat}-T_s$), $\delta_{HC}$ and h are the hydrophobic coating thickness (~1 nm) and pillar height, respectively, $k_{HC}$, $k_w$, and $k_p$ are the hydrophobic coating, water, and pillar thermal conductivities, respectively, and $h_i$ is the interfacial condensation heat transfer coefficient. See Umur, A.; Griffith, P., Mechanism of Dropwise Condensation. *J Heat Transf* 1965, 87 (2), 275-&, which is incorporated by reference in its entirety. φ is the solid fraction of the micro/nanostructures. In the special case of a flat surface, φ=1 and h=0.

Droplet size distribution theory was considered to determine the fraction of droplets with a given radius, R, in the droplet heat transfer model. For small droplets, the droplet distribution is determined by $$n(R) = \frac{1}{3\pi R_e^3 \hat{R}}\left(\frac{R_e}{\hat{R}}\right)^{-2/3} \frac{R(R_e - R^*)}{R - R^*} \frac{A_2 R + A_3}{A_2 R_e + A_3} \exp(B_1 + B_2) \quad (9)$$

where $$B_1 = \frac{A_2}{\tau A_1}\left[\frac{R_e^2 - R^2}{2} + R^*(R_e - R) - R^{*2}\ln\left(\frac{R - R^*}{R_e - R^*}\right)\right] \quad (10)$$

$$B_2 = \frac{A_3}{\tau A_1}\left[R_e - R - R^*\ln\left(\frac{R - R^*}{R_e - R^*}\right)\right] \quad (11)$$

$$\tau = \frac{3R_e^2(A_2^2 R_e + A_3)^2}{A_1(11A_2^2 R_e^2 - 14A_2 R_e R^* + 8A_3 R_e - 11A_3 R^*)} \quad (12)$$

$$A_1 = \frac{\Delta T}{h_{fg}\rho_w(1-\cos\theta)^2(2+\cos\theta)} \quad (13)$$

$$A_2 = \frac{\theta}{4k_w\sin\theta} \quad (14)$$

$$A_3 = \frac{1}{2h_i(1-\cos\theta)} + \frac{1}{k_{HC}\sin^2\theta}\left[\frac{k_p\phi}{\delta_{HC}k_p + hk_{HC}} + \frac{k_w(1-\phi)}{\delta_{HC}k_p + hk_{HC}}\right]^{-1} \quad (15)$$

$\hat{R}$ is the average departure radius, $R^*$ is the critical droplet size for nucleation, τ is the droplet sweeping period, and $R_s$ is the radius when droplets begin to merge and grow by droplet coalescence afterwards, $R_e = l_c/2$ with $l_c$ being the coalescence length determined by nucleation density, N $$l_C = (4N)^{-1/2} \quad (16)$$

See Kim, S.; Kim, K. J., Dropwise Condensation Modeling Suitable for Superhydrophobic Surfaces. *J Heat Trans-T Asme* 2011, 133 (8), and Rose, J. W., On the mechanism of dropwise condensation. *International Journal of Heat and Mass Transfer* 1967, 10 (6), 755-762, each of which is incorporated by reference in its entirety.

For large droplets growing mainly due to coalescence, the droplet distribution can be determined as $$N(R) = \frac{1}{3\pi R^2 \hat{R}}\left(\frac{R}{\hat{R}}\right)^{-2/3} \quad (17)$$

The total surface condensation heat flux, q″, can be obtained by incorporating the individual droplet heat transfer rate (Eqn. 8) with the droplet size distributions (Eqns. 9 and 17)

$$q'' = \int_{R^*}^{R_e} q(R)n(R)dR + \int_{R_e}^{\hat{R}} q(R)N(R)dR \quad (18)$$

The total condensation heat transfer coefficient is determined as $$h_C = q''/\Delta T \quad (19)$$

Therefore, the sensitivity of $h_c$ on the departure radius, advancing contact angle and nucleation density can be obtained as shown in FIG. 7.

Figure 11A:
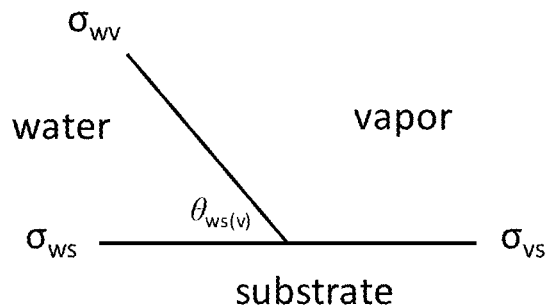
FIGS. 11A, 11B and 11C are schematics showing the relations between interfacial energies and contact angle using Young's equation.
Figure 11B:
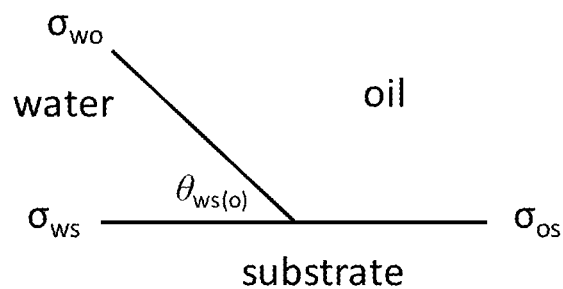
Figure 11C:
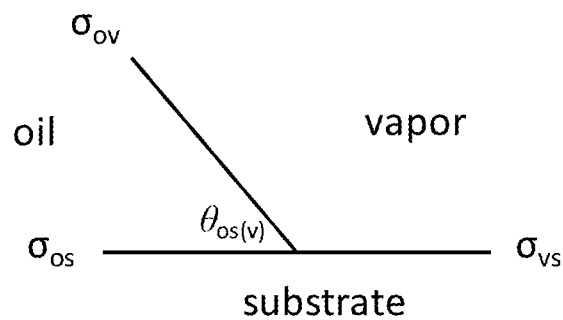

Estimation of Local Contact Angle on High-Surface-Energy Sites with the Existence of Oil As shown in FIG. 11, on a high-surface-energy domain of the TFTS coating without oil-infusion, the local contact angle of a water droplet on a surface, $\theta_{ws(v)}$, can be determined using Young's equation as $$\cos\theta_{ws(v)} = \frac{\sigma_{vs} - \sigma_{ws}}{\sigma_{ws}} \quad (20)$$

where $\sigma_{vs}$ is the interfacial energy between the surface and vapor, $\sigma_{ws}$ is the interfacial energy between water and the surface, and $\sigma_{wv}$ is the interfacial energy between water and vapor, which is 72 mJ/m².

Similarly, with the introduction of oil which surrounds the water droplet on a surface, the local contact angle, $\theta_{ws(o)}$, can be determined as $$\cos\theta_{ws(o)} = \frac{\sigma_{os} - \sigma_{ws}}{\sigma_{wo}} = \frac{\sigma_{os} - \sigma_{vs} + \sigma_{vs} - \sigma_{ws}}{\sigma_{wo}} \quad (21)$$

where $\sigma_{os}$ is the interfacial energy between the surface and oil, $\sigma_{ws}$ is the interfacial energy between water and the surface, and $\sigma_{wo}$ is the interfacial energy between water and oil, which is 49 mJ/m². See Anand, S.; Paxson, A. T.; Dhiman, R.; Smith, J. D.; Varanasi, K. K., Enhanced Condensation on Lubricant Impregnated Nanotextured Surfaces. *Acs Nano* 2012, which is incorporated by reference in its entirety.

Since $\sigma_{os}$ is experimentally difficult to obtain for the system, bounds for the local contact angle for the water-oil-substrate system, $\theta_{ws(o)}$, are provided as follows. The contact angle of oil on the high-surface-energy domain is considered using $$\cos\theta_{os(v)} = \frac{\sigma_{vs} - \sigma_{os}}{\sigma_{ov}} \quad (22)$$

where $\sigma_{ov}$ is the interfacial energy between vapor and oil, which is 17 mJ/m². Since the oil wets the TFTS-coated surface, which means $\theta_{os(v)} < 90°$. Therefore, it can be determined that $0 < \sigma_{vs} - \sigma_{os} < 17$ mJ/m².

As a result, the local contact angle of the water droplet on a surface surrounded by oil can be bounded as $$\cos\theta_{ws(o)} = \frac{\sigma_{os} - \sigma_{vs} + \sigma_{vs} - \sigma_{ws}}{\sigma_{wo}} \in \left(\frac{-17+36}{49}, \frac{0+36}{49}\right) \quad (23)$$

$$\therefore \theta_{we(o)} \in (43°, 67°)$$

Derivation of Nucleation Rate as a Function of Contact Angle and Interfacial Energy The nucleation rate, J, can be determined by classical nucleation theory (CNT) as $$J = zf^* \exp(-G^*) \quad (24)$$

See, Kashchiev., D., *Nucleation: Basic Theory with Applications*. 1 ed.; Oxford: Butterworth-Heinemann: 2000, which is incorporated by reference in its entirety. In Eqn. (20), z is the Zeldovich factor and G* is the dimensionless energy barrier, given by $$z = (kT \ln S)^2 / 8\pi v_o \sqrt{kT\psi(\theta)y^3} \quad (25)$$

$$G^* = 16\pi\psi(\theta)v_o^2 y^3 / 3(kT)^2 (\ln S)^2 \quad (26)$$

where S is the supersaturation and $\psi(\theta)$ is the activity that accounts for the effect of contact angle. f* is the frequency of monomer attachment to the critical droplet nucleus dependent on the nature of the nucleus growth. The main modes of growth during heterogeneous nucleation are limited via direct impingement of monomers to the nucleus or surface diffusion. See Pound, G. M.; Simnad, M. T.; Yang, L., Heterogeneous Nucleation of Crystals from Vapor. *The Journal of Chemical Physics* 1954, 22 (7), 1215-1219 and Sigsbee, R. A., Adatom Capture and Growth Rates of Nuclei. *J Appl Phys* 1971, 42 (10), 3904-3915, each of which is incorporated by reference in its entirety.

The frequency of monomer attachment due to direct vapor impingement is given by $$f^*_i = y_n I (1-\cos(\theta_w))/2\psi^{2/3}(\theta)(36\pi v_o^2)^{1/3} n^{2/3} \quad (27)$$

where $y_n$ is the sticking coefficient ($0 < y_n < 1$), I is the classical Hertz-Knudsen impingement rate ($I = P/\sqrt{2\pi m_o kT}$), n is the number of molecules in the nucleated cluster, and $v_o$ is the volume of an individual water molecule ($v_o = 3 \times 10^{-29}$ m³). To determine an upper bound on the nucleation rate, a sticking coefficient of one was assumed ($y_n = 1$).

The frequency of monomer attachment due to surface diffusion is given by $$f^*_{ad} = y_n c^* \lambda_s^2 I \quad (28)$$

where c* is the capture number due to surface diffusion ($1 < c^* < 5$), and 2, is the mean surface diffusion distance of an adsorbed monomer on the substrate. The capture number c* is size independent and approximately equal to 1.9 for heterogeneous condensation of water vapor. See Pocker, D. J.; Hruska, S. J., Detailed Calculations of the Number of Distinct Sites Visited in Random Walk on Several Two-Dimensional Substrate Lattices. *Journal of Vacuum Science and Technology* 1971, 8 (6), 700-707, which is incorporated by reference in its entirety. The mean surface diffusion distance is dependent on the wettability of the substrate and is given by $\lambda_s = \sqrt{D_{sd}\tau_d}$ where $D_{sd}$ is the surface diffusion coefficient ($D_{sd} = d_s^2 v_s \exp[-E_{sd}/kT]$), $\tau_d$ is the desorption time ($\tau_d = (1/v_s) \exp[-E_{des}/kT]$), $v_s$ is the adsorbed molecule vibration frequency determined using the Debye approximation ($v_s = V_D a/2$), $d_s$ is the length of a molecular jump along the substrate surface approximated by the lattice constant of the substrate ($d_s = 5.4$ Å) (see J. P. Hirth; G. M. Pound, *Condensation and evaporation—nucleation and growth kinetics* England: Pergamon Press: 1963, which is incorporated by reference in its entirety) and $V_D$ is the speed of sound in the substrate ($V_D = 8433$ m/s). The desorption and surface diffusion energies are given by $E_{des} = E_1 + \sigma_{sv} a_o$ and $E_{sd} = 0.5 E_{des}$ (See Thiel, P. A.; Madey, T. E., The interaction of water with solid surfaces: Fundamental aspects. *Surface Science Reports* 1987, 7 (6-8), 211-385, which is incorporated by reference in its entirety), respectively, where $E_1$ is the binding energy of an n=1 sized cluster, $\sigma_{sv}$ is the solid-vapor interfacial energy and $a_o$ is the water molecule surface area ($a_o = 4.67 \times 10^{-19}$ m²). The calculated energies of desorption show excellent agreement with that of the experiments and molecular dynamics simulations ($E_{des,SiO2} = 0.9$ eV). See Israelachvili, J. N., *Intermolecular and surface forces*. 2nd ed.; Academic Press: Amsterdam, 1991, and Ma, Y.; Foster, A. S.; Nieminen, R. M., Reactions and clustering of water with silica surface. *The Journal of Chemical Physics* 2005, 122 (14), 144709-9, each of which is incorporated by reference in its entirety.

By adding the nucleation rate from the two mechanisms together, the nucleation rate, J, can be determined as a function of the contact angle and interfacial energy of the condensate at given supersaturations, as shown in FIG. 8K.

Control Experiments on Homogeneous Hydrophobic Surfaces

Dimethyldicholorosilane (DMCS), which is a homogeneous hydrophobic coating, was used in the studies for control experiments. DMCS can be deposited on silicon surfaces using the vapor deposition process as described in the Methods section.

Figure 12A:
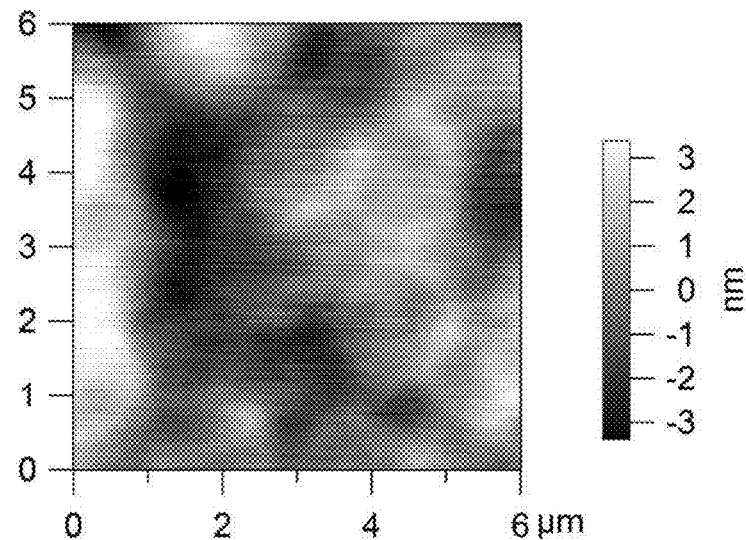
FIG. 12A is AFM height images of flat silicon surfaces coated with DMCS.

An atomic force microscope (AFM) image of a flat silicon surface coated by DMCS is shown in FIG. 12A. No high-surface-energy domains with the coatings were observed. The advancing and receding contact angles on the DMCS coated surface were measured to be $\theta_a/\theta_r=103.8°\pm0.5°/102.7°\pm0.4°$, respectively. The hysteresis was significantly lower compared to TFTS-coated surfaces, which also indicates the homogeneity of the DMCS coating.

Figure 12B:
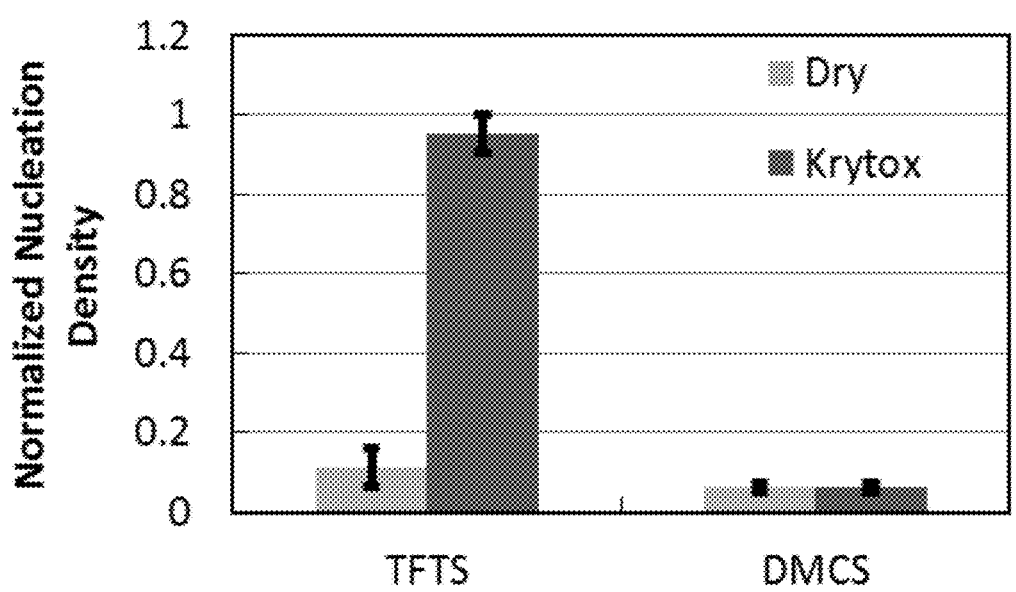
FIG. 12B is a graph depicting comparison of nucleation densities on surfaces with TFTS and DMCS coatings.
Figure 13:
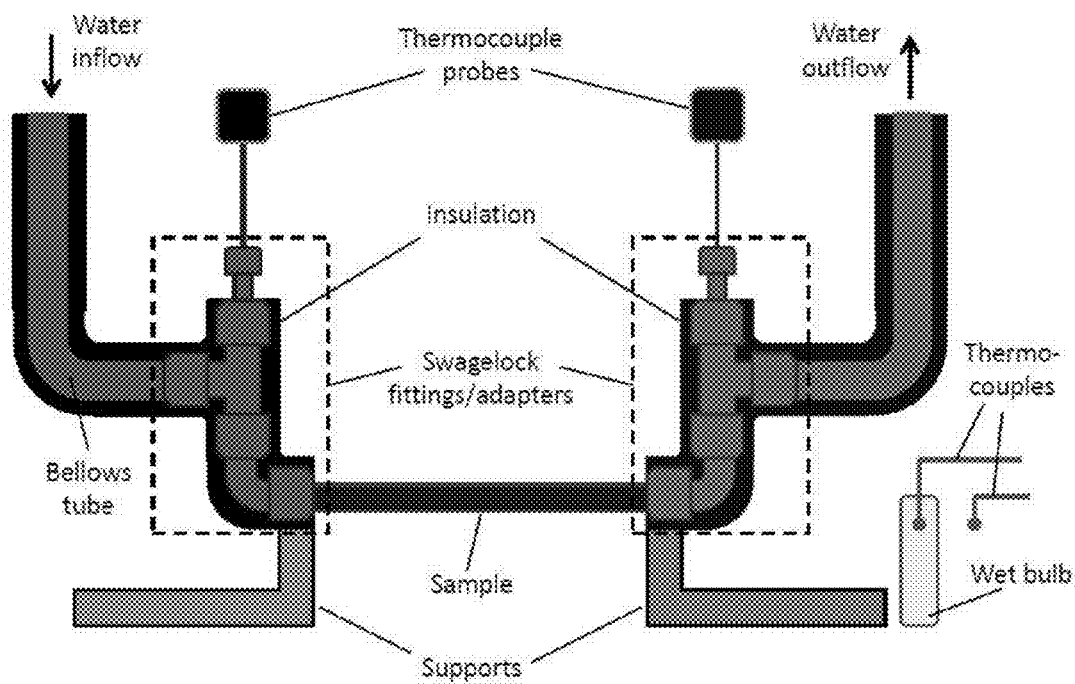
FIG. 13 is a schematic of experimental setup inside the chamber.

Condensation experiments were performed on micropillar arrays coated by DMCS with and without oil-infusion using the same experimental setup for the condensation experiment on TFTS-coated micropillar arrays, as described in the Methods section. The results are summarized and compared to the TFTS-coated surfaces in FIG. 12B. The nucleation density was normalized against the density of pillars for a fair comparison between different geometries. The nucleation density increase was not observed on DMCS-coated surfaces even after oil-infusion, as predicted by classical nucleation theory. Note that classical theory predicted nucleation rates as low as $0.2\ m^{-2}s^{-1}$ on TFTS-coated surfaces without oil-infusion. However, in experiments, some rare nucleation was observed as shown in FIG. 12B. Repeated condensation experiments showed that nuclei formation and droplet pinning occurred on identical spots for each subsequent test, indicating that the spots are defects in the silane coatings where the hydrophilic silicon oxide surface (contact angle $\theta=38°$) was exposed. Such defects, while limited in number, act as nucleation sites for condensation.

Heat Transfer Measurement Apparatus and Experimental Procedure

A custom environmental chamber was built to test the heat transfer performance of each sample for the study. The vacuum chamber was made of stainless steel with two viewing windows. Resistive heater lines were wrapped around the exterior of the chamber walls to prevent condensation at the inside walls, and the chamber was wrapped with insulation on the exterior walls. Two insulated stainless steel water flow lines (Swagelok) were fed into the chamber via a KF flange port to supply cooling water to the chamber from a large capacity chiller (System III, Neslab). A flow meter (7 LPM MAX, Hedland) having an accuracy of ±2% was integrated along the water inflow line.

A secondary stainless steel tube line was fed into the chamber via a KF adapter port that served as the flow line for the incoming water vapor supplied from a heated steel water reservoir. The vapor line was wrapped with a rope heater (60 W, Omega) and controlled by a power supply (Agilent). The vapor reservoir was wrapped with another independently-controlled rope heater (120 W, Omega) and insulated to limit heat losses to the environment. The access tubes were welded to the vapor reservoir, each with independently-controlled valves. The first valve (Diaphragm Type, Swagelok), connecting the bottom of the reservoir to the ambient, was used to fill the reservoir with water. The second valve (BK-60, Swagelok), connecting the top of the reservoir to the inside of the chamber, was used to provide a path for vapor inflow. K-type thermocouples were located along the length of the water vapor reservoir to monitor temperature. To obtain the temperatures within the chamber, K-type thermocouple bundles were connected through the chamber apertures via a thermocouple feed through (Kurt J. Lesker). A pressure transducer (925 Micro Pirani, MKS) was attached to monitor pressure within the chamber. The thermocouple bundles and the pressure transducer were both connected to an analog input source (RAQ DAQ, National Instruments), which was interfaced to a computer to record and store data. A second bellows valve (Kurt J. Lesker) on the chamber was connected to a vacuum pump to bring the chamber down to vacuum conditions prior to vapor filling. A liquid nitrogen cold trap was placed between the chamber and vacuum pump which served to remove any moisture from the pump-down process.

To run the test samples inside the chamber, the stainless steel bellows tube lines (¼", Swagelok) were connected to the external water flow lines. T-connection adapters (Swagelok) with bore through Ultra-Torr fittings (Swagelok) were used to adapt K-type thermocouple probes (Omega) at the water inlet and outlet. Prior to experimentation, the thermocouple probes were calibrated using a high precision temperature controlled bath (Lauda Brinkman) to an accuracy of ±0.2 K. The test samples, 6.35 mm diameter tubes with different surface treatments, were connected via a Swagelok compression fitting onto the T-connection. Chilled water flows through the inlet bellows tube, along the inside of the tube sample and through the outlet. Two supports were used to hold the sample and the entire configuration in place. Two separate pieces of insulation were embedded with K-type thermocouple leads and used for wet bulb temperature measurements during experimental runs. A third thermocouple was placed beside the sample to measure the reference temperature inside the chamber. As the experiment progressed, the wet-bulb insulating wick collected water from the bottom of the chamber to the embedded thermocouple. The temperature measured by this thermocouple was compared to the reference temperature calculated from the saturation pressure. This allowed for a high accuracy secondary measurement of saturation conditions inside the chamber. FIG. F3 shows the schematic of the test setup for the heat transfer performance measurement.

For each experimental trial, a set of strict procedures were used to ensure consistency throughout the experiments. The water vapor reservoir was filled with approximately 3.5 liters of DI water (99% full) using a syringe through the vapor release valve. After opening the vapor inflow valve and closing the vapor release valve, the rope heater around the water vapor reservoir was turned on and the heater controller set to maximum output. Then the rope heater connected to the vapor inflow valve was turned on. The temperature of the water reservoir was monitored with the installed thermocouples. Once boiling was achieved and all thermocouples on the reservoir reached >95° C. for at least 10 minutes, the vapor inflow valve was closed.

The next step was to begin the vacuum pump-down procedure. Valves connecting the chamber with the ambient, and valves connecting the chamber and the vacuum pump were both closed while the valve connected to the liquid nitrogen cold trap was opened. The vacuum pump was then turned on, initiating the pump-down process where the pressure inside the chamber was carefully monitored. This process took ≈30 minutes in order to achieve the target non-condensable gases pressure (≈30 Pa).

After pumping down, the vapor inflow valve was opened to allow steam flow into the chamber and condensation occurred on the surface of the tube. The heat flux was determined by the rise in the temperature of the chilled water from the inlet to the outlet. The temperature difference, $\Delta T$ was determined as the log-mean temperature difference (LMTD) between the vapor and the chilled water. See Mills, A. F., *Heat and Mass Transfer.* 2 ed.; Prentice-Hall: 1999, which is incorporated by reference in its entirety. Each data point in FIG. 10 was determined over 10 minutes of steady state operation. After that, the vapor inflow valve was adjusted to change the vapor pressure in the chamber. The error bars in FIG. 10 were determined based on the uncertainty in the thermocouple and flow rate measurement. The duration of each experimental run was around 45-60 minutes. The thermal conductivity of the Krytox GPL 100 oil was 0.08-0.09 W/mK. See Dupont KRYTOX Overview, which is incorporated by reference in its entirety. The associated conduction thermal resistance of the oil layer is very small due to the small thickness (≈1 µm). The oil-infusion was found to be very stable over days without significant change in heat transfer performance.

Droplet Shedding Radius

Figure 14A:
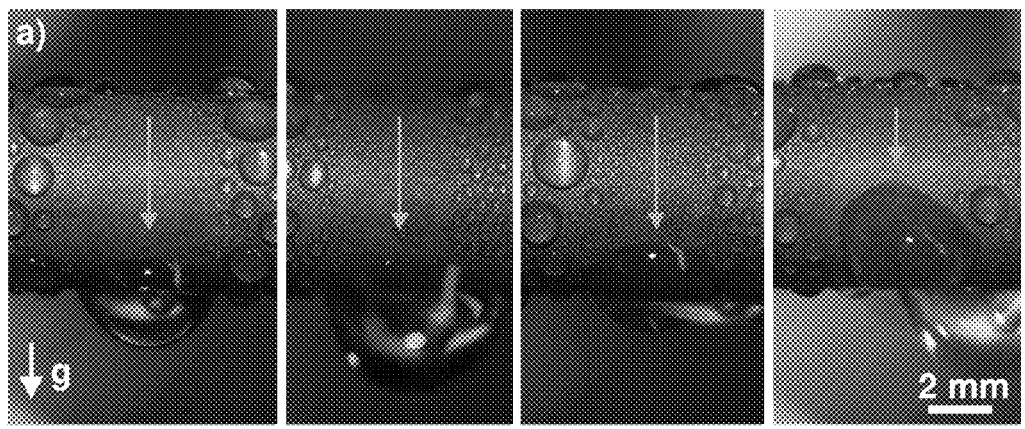
FIG. 14A is a series of photographs depicting droplet shedding radii on a dropwise hydrophobic surface.
Figure 13B:
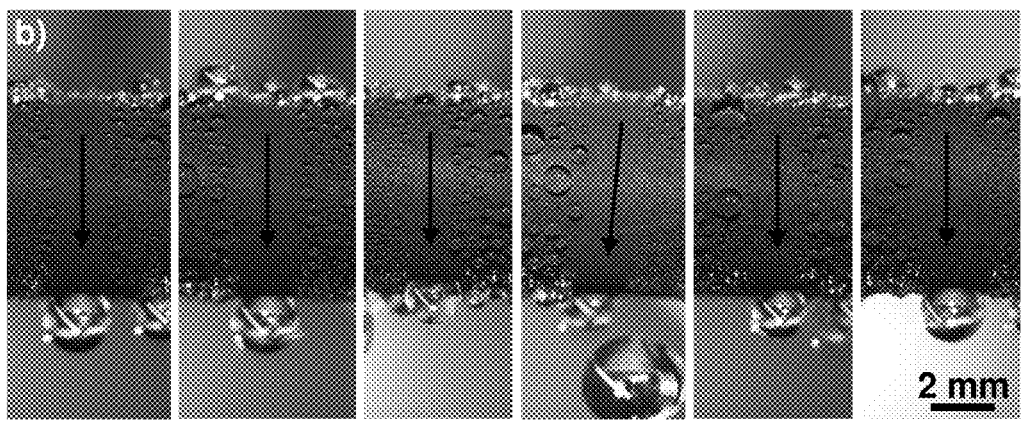

The experimentally-determined average droplet shedding radii ($\hat{R}$) for a typical dropwise hydrophobic surface (FIG. 14A) and a Krytox oil-infused immersion condensation surface (FIG. 14B) were determined via direct measurement through frame-by-frame analysis of high speed video. Videos (90 frames per second) of the condensation process taken at ≈2.4 kPa vapor pressure were analyzed to determine the radius of droplets that slide down from the top half of the surface and clean the surface for re-nucleation. Droplet size measurements were taken just prior to droplet sliding down the tube (to avoid coalescence effects). The shedding radius was averaged for 50 droplets for each tube sample and was determined to be $\hat{R}_{DHP}$=1.83±0.31 mm and $\hat{R}_{IC}$=0.98±0.13 mm on the typical dropwise hydrophobic and oil-infused surfaces, respectively. Reported error is due to droplet shedding variance from droplet to droplet.

Examples of Condensation Behavior

In case of TFTS-coated silicon micropillar array where the pillar diameters are 5 µm periods are 15 µm and the supersaturation in the experiment is S=1.6, almost no nucleation was observed except on sparse defects in the TFTS coating where hydrophilic silicon oxide substrate was exposed. In case of immersion condensation behavior on oil-infused TFTS-coated silicon micropillar array, where the pillar diameters are 5 µm, periods are 15 µm, and the supersaturation in the experiment is S=1.6, Nucleation occurred on every tip of the pillars, which yields over an order of magnitude higher nucleation density compared to TFTS-coated silicon micropillar array.

When a regular hydrophobic copper tube is horizontally placed with chilled water flowing inside with flow rate of 5 L/min and the vapor pressure in the experiment is ≈2.4 kPa, droplets grow and coalesce before removed by gravity at diameters around 2 mm. When an oil-infused TFTS-coated copper oxide tube is horizontally placed with chilled water flowing inside with flow rate of 5 L/min, and the vapor pressure in the experiment is ≈2.4 kPa, higher droplet density was observed compared to the regular hydrophobic copper tube while the departure diameter is reduced to approximately 0.98±0.13 mm.

In summary, over an order of magnitude increase in the nucleation density on hydrophobic silicon pillar arrays coated with a long-chain silane molecule was observed when hydrophobic oil was introduced on the surface. AFM imaging revealed the existence of locally hydrophilic micelles despite the overall hydrophobicity of the silane self-assembled coating (SAC). The increased nucleation density is explained in the context of classical nucleation theory as the combined effect of the hydrophilic micelles and the reduction in interfacial energy between water and oil. Control experiments on silicon pillar arrays with hydrophobic coatings without micelles and hydrophilic coatings were performed to support these findings. Such phenomena could potentially be used to create surfaces for enhanced condensation heat transfer for a variety of thermal and energy systems.

Other embodiments are within the scope of the following claims.

What is claimed is:

1. A superhydrophobic surface comprising:
a patterned substrate having a surface including a plurality of first regions distributed in a second hydrophobic region, the first regions including a surface modifying layer and the second hydrophobic region including a material infused into regions of the substrate.

2. The surface of claim 1, wherein the patterned substrate includes a periodic structure on the surface of the substrate that form the regions of the substrate into which the material is infused.

3. The surface of claim 1, wherein the first regions are associated with the pattern of the patterned substrate.

4. The surface of claim 3, wherein the surface modifying layer includes a functionalized silane.

5. The surface of claim 4, wherein the surface modifying layer includes a plurality of scattered hydrophilic sites while exhibiting overall hydrophobicity.

6. The surface of claim 1, wherein the material is an oil.

7. The surface of claim 6, wherein the oil is a fluorinated oil.

8. A method of increasing nucleation density on a surface comprising:
infusing a material into regions of a patterned substrate to form a surface including a plurality of first regions distributed in a second hydrophobic region, the first regions including a surface modifying layer and the second hydrophobic region including a material infused into regions of the substrate.

9. The method of claim 8, wherein the patterned substrate includes a periodic structure on the surface of the substrate that form the regions of the substrate into which the material is infused.

10. The method of claim 8, wherein the first regions are associated with the pattern of the patterned substrate.

11. The method of claim 8, wherein the surface modifying layer includes a functionalized silane.

12. The method of claim 11, wherein the surface modifying layer includes a plurality of scattered hydrophilic sites while exhibiting overall hydrophobicity.

13. The method of claim 8, wherein the material is an oil.

14. The method of claim 13, wherein the oil is a fluorinated oil.

* * * * *